United States Patent
Ichiyama et al.

(10) Patent No.: US 7,834,639 B2
(45) Date of Patent: Nov. 16, 2010

(54) JITTER INJECTION CIRCUIT, PATTERN GENERATOR, TEST APPARATUS, AND ELECTRONIC DEVICE

(75) Inventors: Kiyotaka Ichiyama, Tokyo (JP); Masahiro Ishida, Tokyo (JP)

(73) Assignee: Advantest Corporation, Tokyo (JP)

(*) Notice: Subject to any disclaimer, the term of this patent is extended or adjusted under 35 U.S.C. 154(b) by 327 days.

(21) Appl. No.: 12/022,162

(22) Filed: Jan. 30, 2008

(65) Prior Publication Data

US 2009/0189666 A1    Jul. 30, 2009

(51) Int. Cl.
    *G01R 31/02* (2006.01)
(52) U.S. Cl. ............... 324/537; 324/603; 324/612; 702/69; 714/705
(58) Field of Classification Search ........ 324/537; 702/69

See application file for complete search history.

(56) References Cited

U.S. PATENT DOCUMENTS

| 7,516,374 | B2* | 4/2009 | Hsu et al. ............ 714/705 |
| 2001/0011893 | A1* | 8/2001 | Walker ............ 324/603 |
| 2004/0251914 | A1* | 12/2004 | Doi et al. ............ 324/537 |
| 2008/0172193 | A1* | 7/2008 | Rhee et al. ............ 702/69 |

FOREIGN PATENT DOCUMENTS

JP    WO2007049365    5/2007

* cited by examiner

*Primary Examiner*—Timothy J Dole
*Assistant Examiner*—Benjamin M Baldridge
(74) *Attorney, Agent, or Firm*—Osha Liang LLP

(57) ABSTRACT

Provided is a jitter injection circuit that generates a jittery signal including jitter, including a plurality of delay circuits that receive a supplied reference signal in parallel and that each delay the received reference signal by a preset delay amount and a signal generating section that generates each edge of the jittery signal according to a timing of the signal output by each delay circuit. In the jitter injection circuit the delay amount of at least one delay circuit is set to be a value different from an integer multiple of an average period of the jittery signal.

15 Claims, 19 Drawing Sheets

JITTER INJECTION CIRCUIT, PATTERN GENERATOR, TEST APPARATUS, AND ELECTRONIC DEVICE

BACKGROUND

1. Technical Field

The present invention relates to a jitter injection circuit, a pattern generator, a test apparatus, and an electronic device. More particularly, the present invention relates to a jitter injection circuit that generates a jittery signal containing jitter, a pattern generator that generates a data signal containing jitter, a test apparatus that tests a device under test using a test signal into which jitter is injected, and an electronic device provided with a self diagnostic section that tests a circuit under test using a test signal into which jitter is injected.

2. Related Art

A jitter tolerance testing is a type of testing performed for high speed communication devices and high speed serial I/O devices. For example, according to a recommendation from the ITU-T, a testing is defined in which jitter tolerance testing is performed by injecting jitter having a frequency of several hundred MHz into the communication data.

As a method for injecting jitter into a high frequency signal, a method is considered in which jitter is injected into a clock signal generated by a voltage controlled oscillator by injecting a modulated signal into a control input of the voltage controlled oscillator, and a data signal is then generated using the clock signal.

Another method is considered in which a variable delay circuit is disposed at a stage after a generator that generates a clock signal or a data signal and the jitter is injected by changing the delay control input of the variable delay circuit. An example of a jitter injection method using the variable delay circuit is disclosed in Pamphlet No. WO2007/049365.

During actual implementation of the electronic device, it is important to minimize the bit error ratio caused by the high frequency jitter component. Therefore, it is also desirable that the high frequency jitter be injected into the test apparatus testing the electronic device.

In a case where the jitter is generated by modulating the control input of the voltage controlled oscillator as described above, however, it is difficult to quickly modulate the clock signal with the control input, so that a frequency boundary of the generated jitter is only tens of MHz. In a case where the jitter is generated by changing the delay amount of the variable delay circuit, jitter having high frequency and large amplitude cannot be generated because the variable delay circuit requires time to catch up to the change of the delay setting.

SUMMARY

Therefore, it is an object of an aspect of the innovations herein to provide a jitter injection circuit, a pattern generator, a test apparatus, and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a jitter injection circuit that generates a jittery signal including jitter, including a plurality of delay circuits that receive a supplied reference signal in parallel and that each delay the received reference signal by a preset delay amount and a signal generating section that generates each edge of the jittery signal according to a timing of the signal output by each delay circuit, the jitter injection circuit wherein the delay amount of at least one delay circuit is set to be a value different from an integer multiple of an average period to be included in the jittery signal.

According to a second aspect related to the innovations herein, one exemplary apparatus may include a test apparatus that tests a device under test, including a jitter injection circuit that generates a jittery signal containing jitter, a test signal generating section that generates a test signal based on the jittery signal and supplies the generated test signal to the device under test, and a measuring section that measures a response signal output by the performance circuit in response to the test signal and makes a judgment concerning pass/fail of the performance circuit based on the measured response signal. In the test apparatus, the jitter injection circuit includes a plurality of delay circuits that receive a supplied reference signal in parallel and that each delay the received reference signal by a preset delay amount and a signal generating section that generates each edge of the jittery signal according to a timing of the signal output by each delay circuit. Furthermore, in the test apparatus, the delay amount of at least one delay circuit is set to be a value different from an integer multiple of an average period to be included in the jittery signal.

According to a third aspect related to the innovations herein, one exemplary apparatus may include an electronic device that houses a performance circuit and a self diagnostic section that tests the performance circuit. In the electronic device, the self diagnostic section includes a jitter injection circuit that generates a jittery signal containing jitter, a test signal generating section that generates a test signal based on the jittery signal and supplies the generated test signal to the performance circuit, and a measuring section that measures a response signal output by the performance circuit in response to the test signal and makes a judgment concerning pass/fail of the performance circuit based on the measured response signal. Furthermore, in the electronic device, the jitter injection circuit includes a plurality of delay circuits that receive a supplied reference signal in parallel and that each delay the received reference signal by a preset delay amount and a signal generating section that generates each edge of the jittery signal according to a timing of the signal output by each delay circuit. Yet further, in the electronic device, the delay amount of at least one delay circuit is set to be a value different from an integer multiple of an average period to be included in the jittery signal.

According to a fourth aspect related to the innovations herein, one exemplary apparatus may include a pattern generator that generates a data signal that includes both jitter and a predetermined logic pattern, including a plurality of delay circuits that receive a supplied reference signal in parallel and that each delay the received reference signal by a preset delay amount; a signal generating section that generates each edge of the data signal according to a timing of the signal output by each delay circuit; and a delay setting section that determines what multiple of the single bit time of the data signal is used in the delay amount to be set for each delay circuit according to a timing of logic value shifts in a logic pattern to be to be included in the data signal, and sets for each delay circuit a value obtained by adding or subtracting a jitter value to be injected to or from each of the determined delay amounts.

According to a fifth aspect related to the innovations herein, one exemplary apparatus may include a test apparatus that tests a device under test, including a pattern generator that generates a test signal that includes both jitter and a predetermined logic pattern and supplies the test signal to the device under test and a measuring section that measures a response signal output by the device under test in response to the test signal and makes a judgment concerning pass/fail of the device under test based on the measured response signal. In the test apparatus, the pattern generator includes a plurality of delay circuits that receive a supplied reference signal in parallel and that each delay the received reference signal by a preset delay amount; a signal generating section that generates each edge of the test signal according to a timing of the signal output by each delay circuit; and a delay setting section that determines what multiple of the single bit time of the test signal is used in the delay amount to be set for each delay circuit according to a timing of logic value shifts in a logic pattern to be to be included in the test signal, and sets for each delay circuit a value obtained by adding or subtracting a jitter value to be injected to or from each of the determined delay amounts.

According to a sixth aspect related to the innovations herein, one exemplary apparatus may include an electronic device that that houses a performance circuit and a self diagnostic section that tests the performance circuit. In the electronic device, the self diagnostic section includes a pattern generator that generates a test signal that includes both jitter and a predetermined logic pattern and supplies the test signal to the device under test and a measuring section that measures a response signal output by the performance circuit in response to the test signal and makes a judgment concerning pass/fail of the performance circuit based on the measured response signal. Furthermore, in the electronic device, the pattern generator includes a plurality of delay circuits that receive a supplied reference signal in parallel and that each delay the received reference signal by a preset delay amount; a signal generating section that generates each edge of the test signal according to a timing of the signal output by each delay circuit; and a delay setting section that determines what multiple of the single bit time of the test signal is used in the delay amount to be set for each delay circuit according to a timing of logic value shifts in a logic pattern to be to be included in the test signal, and sets for each delay circuit a value obtained by adding or subtracting a jitter value to be injected to or from each of the determined delay amounts.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
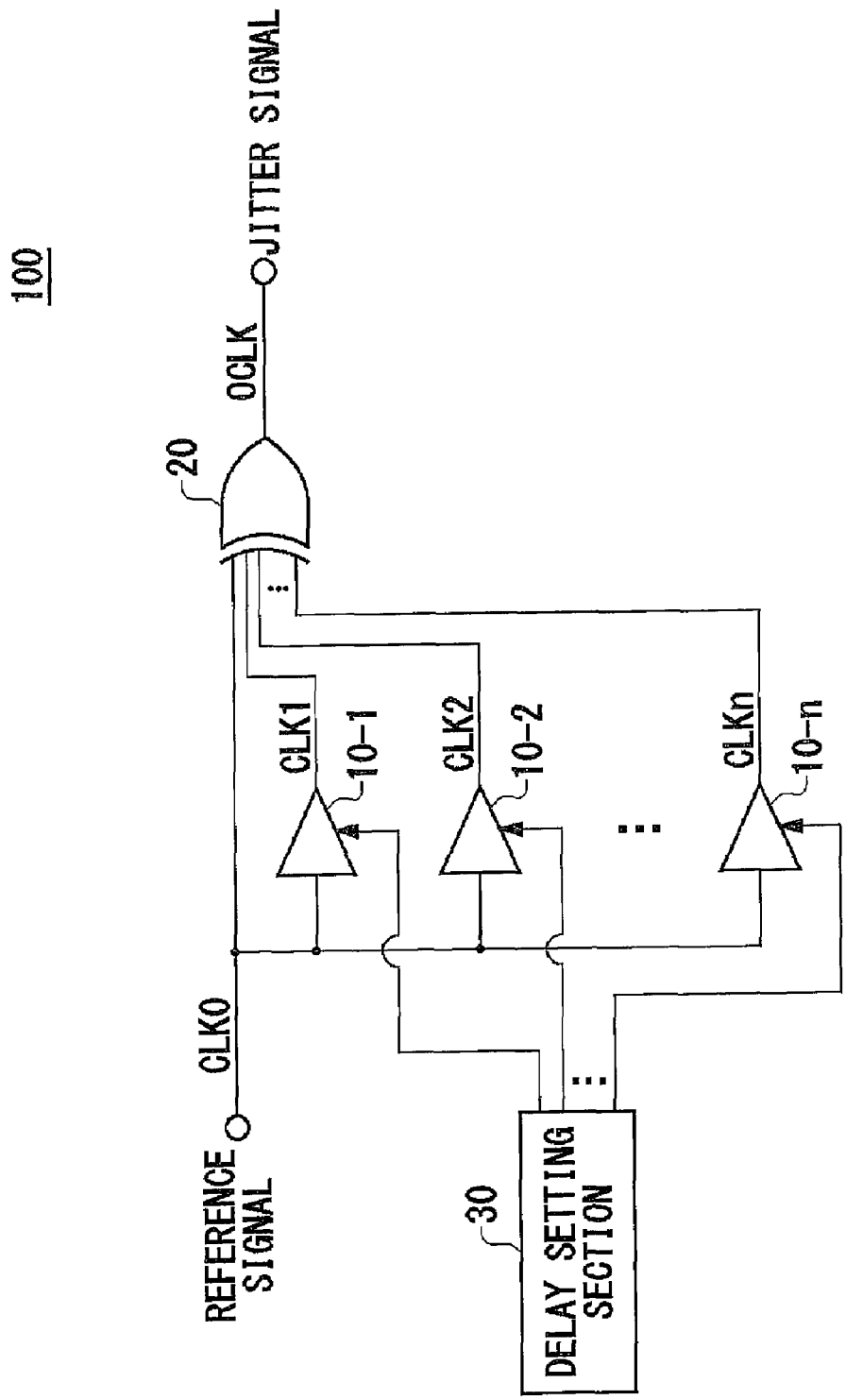
FIG. 1 shows an exemplary configuration of a jitter injection circuit 100 according to an embodiment.

FIG. 1 shows an exemplary configuration of a jitter injection circuit 100 according to an embodiment. The jitter injection circuit 100 is a circuit that generates a jittery signal containing jitter, and is provided with a plurality of delay circuits 10 disposed in parallel, a signal generating section 20, and a delay setting section 30. When generating the jittery signal, the jitter injection circuit 100 of the present embodiment generates the jittery signal using the plurality of delay circuits 10 having fixed delay amounts. More specifically, the jittery signal containing high frequency jitter can be easily generated because the jittery signal can be generated without changing the delay amounts of the delay circuits 10.

The plurality of delay circuits 10 receive in parallel a supplied reference signal CLK0 and each delay circuit 10 delays the signal by a prescribed delay amount. The reference signal CLK0 may be a periodic signal having a predetermined period.

The signal generating section 20 generates each edge of the jittery signal to be output according to the reference signal CLK0 and a timing of the signal output by each delay circuit 10. For example, the signal generating section 20 generates one edge of the jittery signal based on the edge of the signal output by one of the delay circuits 10. Because of this, a position of each edge of the jittery signal can be set according to the delay amount of the corresponding delay circuit 10, so that jitter corresponding to the delay amounts of the plurality of delay circuits 10 can be injected into the jittery signal.

The signal generating section 20 of the present embodiment may be an exclusive OR circuit that outputs an exclusive OR of a plurality of signals (from CLK0 to CLKn). The exclusive OR of the plurality of signals may be a signal that is logic H during a period in which an odd number of signals from among the plurality of signals (from CLK0 to CLKn) indicate logic H and is logic L during a period in which an even number of signals from among the plurality of signals (from CLK0 to CLKn) indicate logic H. When a transition timing of each input signal is different, the signal output by the signal generating section 20 is a signal in which the logic value sequentially inverts at the transition timing of each input signal.

More specifically, the signal generating section 20 outputs a jittery signal in which the logic values are sequentially inverted at the timing of the delay amounts τ1, τ2, τ3, . . . , τk, . . . , τn (note that τk is the delay amount set by the delay circuit 10 at a k-th stage) designated by each of the delay circuits 10. Here, by setting at least one of the delay amounts τk to be a value different than an integer multiple of the average period $T_{OUT}$ Of the jittery signal (a mean duration of each bit in the jittery signal), a jittery signal can be generated that includes timing jitter according to the delay amount τk. The signal including the timing jitter may refer to a signal in which each edge timing varies in relation to an ideal timing.

For example, in a case where timing jitter having a jitter frequency of $f_J(=2 f_{OUT}/(n+1))$ and a sine wave with a jitter amplitude $A_J$ is injected into the jittery signal, the delay amount τk to be set for the delay circuit 10 at the k-th stage is calculated by the following formula. The delay setting section 30 may set the delay amounts of the plurality of delay circuits 10 according to the formula below.

$$\tau_k = \frac{k}{2f_{out}} + A_J \sin\left(\frac{\pi f_J k}{f_{out}}\right)$$

It should be noted that $f_{out}$ indicates the frequency of the jittery signal and is expressed by $f_{out}=1/(2 T_{out})$.

The delay setting section 30 sets the prescribed delay amount in advance for each delay circuit 10. Here, in a case where the delay amount of each delay circuit 10 is set in advance by the jitter injection circuit 100 to be the predetermined delay amount, the jitter injection circuit 100 need not be provided with the delay setting section 30.

The delay setting section 30 may set for each delay circuit 10 a delay amount according to the timing jitter to be injected into each edge of the jittery signal. For example, the delay setting section 30 may set as the delay amount of each delay circuit 10 a value obtained by adding or subtracting a value of the timing jitter to be included at each edge of the jittery signal to or from an integer multiple of the average period $T_{OUT}$ to be included in the jittery signal.

Because the delay amount of each delay circuit 10 is the corresponding edge timing in the jittery signal, a k-th edge of the jittery signal includes timing jitter of τk-k $T_{OUT}$. The delay setting section 30 of the present embodiment fixes the delay amounts of the delay circuits 10 while the jitter injection circuit 100 generates the jittery signal.

Figure 2:
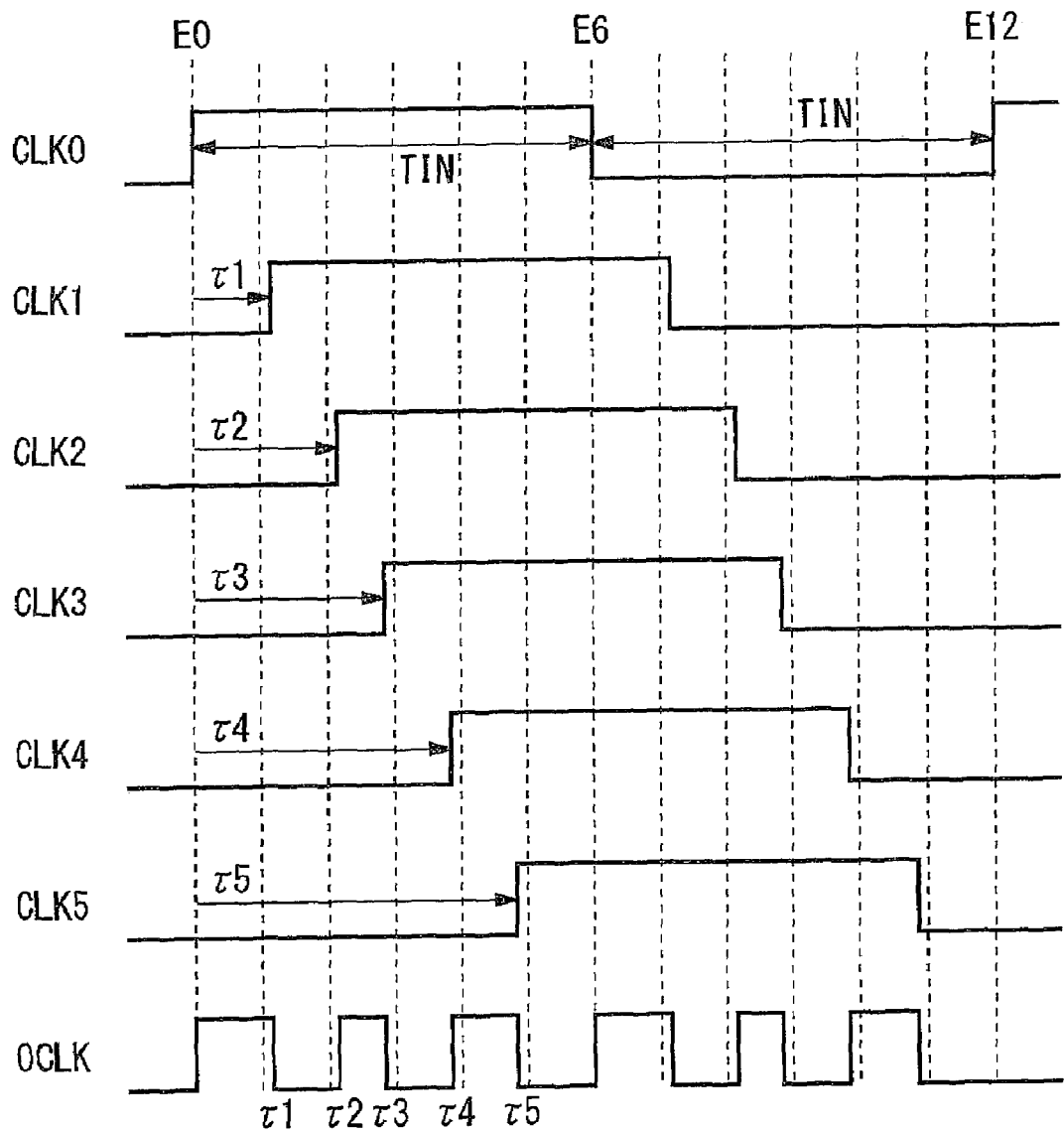
FIG. 2 is a timing chart showing an exemplary operation of the jitter injection circuit 100 shown in FIG. 1.

FIG. 2 is a timing chart showing an exemplary operation of the jitter injection circuit 100 shown in FIG. 1. In the present embodiment, an operation of the jitter injection circuit 100 provided with five stages of delay circuits 10 is described. Furthermore, the following description uses a signal in which the logic value repeatedly inverts at predetermined time intervals $T_{IN}$ as the reference signal CLK0.

The first delay circuit 10-1 delays the reference signal CLK0 by the delay amount τ1 and outputs the thus delayed signal. The delay amount τ1 may be a value calculated by adding or subtracting a prescribed jitter value to or from the average period (or the average pulse width, which is also possible in all following cases) $T_{OUT}$ of the jittery signal OCLK5 to be generated.

Here, the delay setting section 30 may obtain the average period $T_{OUT}$ of the jittery signal OCLK5 by dividing a pulse width (bit duration) $T_{IN}$ of the reference signal CLK0 by a value equal to the parallel number of the delay circuit 10 plus one. The delay setting section 30 may be provided with waveform data of the jitter to be injected. The delay setting section 30 may set the delay amount of each delay circuit 10 based on the average period $T_{OUT}$ and the waveform data.

The second delay circuit 10-2 delays the reference signal CLK0 by a delay amount τ2 and outputs the thus delayed signal. The delay amount τ2 may be a value calculated by adding or subtracting a prescribed jitter value to or from a value that is double the average period $T_{OUT}$ of the jittery signal OCLK5. Furthermore, the delay amount τ2 may be a value different from the delay amount τ1.

In the same manner, each delay circuit 10 delays the reference signal by a value obtained by adding or subtracting a prescribed jitter value to or from an integer multiple of the average period $T_{OUT}$ of the jittery signal OCLK5. By doing this, a plurality of signals indicating each edge timing of the jittery signal to be generated can be input to the signal generating section 20, as shown in FIG. 2. The signal generating section 20 generates a signal in which the logic value sequentially inverts at time intervals τ1, τ2, τ3, τ4, τ5, which correspond to the delay amount of each delay circuit 10.

Furthermore, by causing the maximum delay amount (τ5) in the plurality of delay circuits 10 to be less than the pulse width $T_{IN}$ of the reference signal, a jittery signal into which jitter having the prescribed pattern is repeatedly injected for each period of the pulse width $T_{IN}$ of the reference signal can be generated easily. In such a case, the signal generating section 20 generates a plurality of bits of the jittery signal for each single bit of the reference signal.

The plurality of delay circuits 10 are disposed to correspond to the plurality of edges of the jittery signal generated for each bit of the reference signal. The delay amount of each delay circuit 10 designates the corresponding edge timing.

In the present embodiment, as shown in FIG. 2, a jittery signal can be generated in which the waveform having the edge timing of τ1, τ2, τ3, τ4, τ5 is repeated for each period of the pulse width $T_{IN}$ of the reference signal. Because the jitter is generated in the jitter injection circuit 100 of the present embodiment without dynamically changing the delay times of the delay circuits 10, high frequency jitter can be generated easily.

Because the jitter pattern is repeated for each pulse width $T_{IN}$ of the reference signal in the jitter injection circuit 100 of the present embodiment, the frequency of the generated jitter is substantially equal to an integer multiple of the reference signal bit rate ($1/T_{IN}$).

Figure 3:
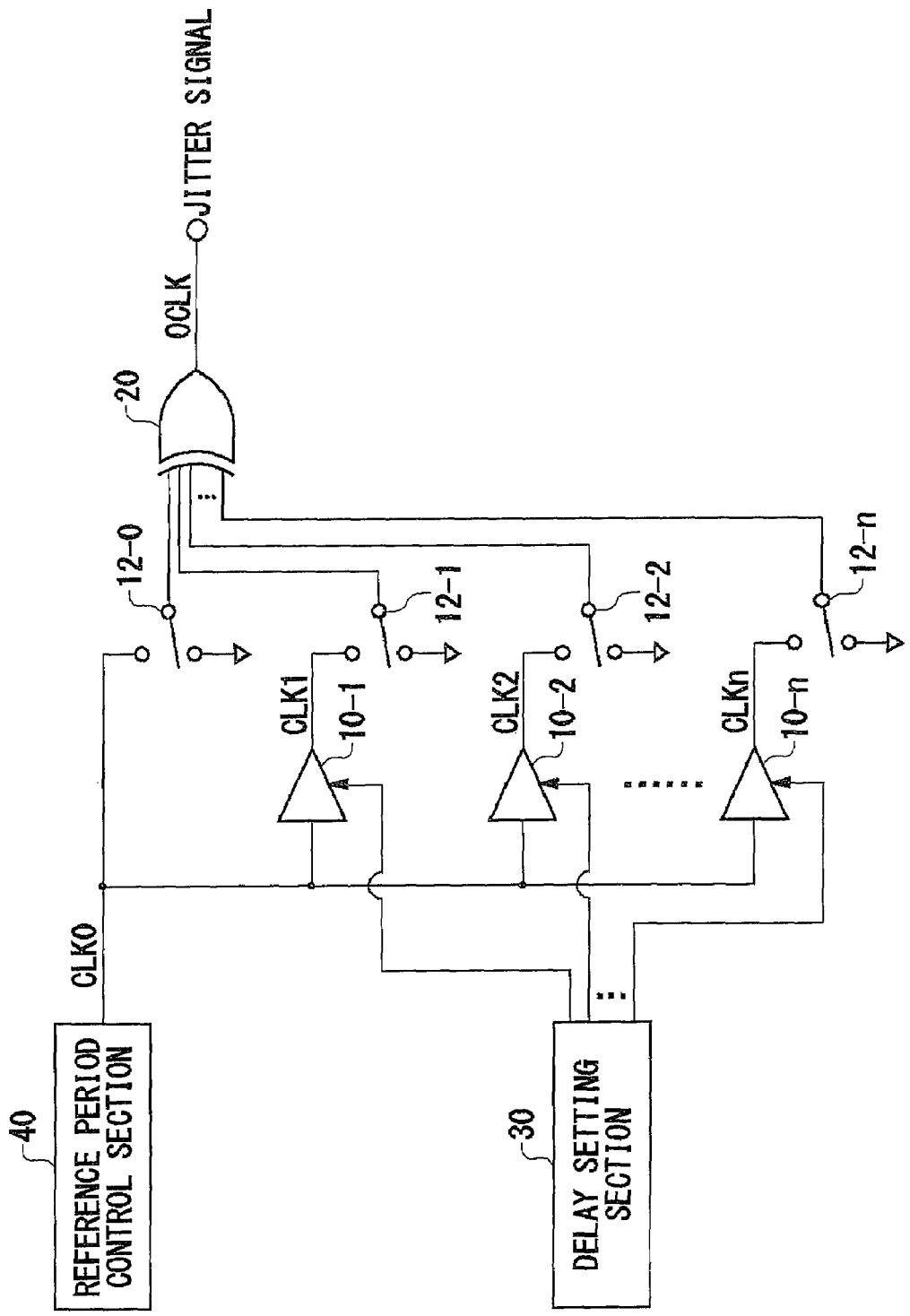
FIG. 3 shows another exemplary configuration of the jitter injection circuit 100.

FIG. 3 shows an exemplary configuration of another jitter injection circuit 100. The jitter injection circuit 100 of the present embodiment is further provided with a reference period control section 40 and selecting sections 12 in addition to the configuration of the jitter injection circuit 100 described in relation to FIG. 1. The jitter injection circuit 100 may have a configuration in which either the reference period control section 40 or the selecting sections 12 are not provided.

As described in relation to FIG. 2, it is desirable that the maximum delay amount in the plurality of delay circuits 10 be less than the pulse width of the reference signal CLK0. In this case, the period of the jitter injected into the jittery signal is equal to the pulse width of the reference signal CLK0 or a fraction thereof having a numerator of one. The reference period control section 40 may control the pulse width of the reference signal CLK0 provided to the plurality of delay circuits 10 according to the period of the jitter to be injected into the jittery signal.

As further described in relation to FIG. 2, the average period (average bit duration) of the jittery signal is a value calculated by dividing the pulse width of the reference signal by a value obtained by adding one to the parallel number n of the delay circuit 10. The selecting sections 12 may select a plurality of signals supplied to the signal generating section 20 from among the output signals CLK(k) of the plurality of delay circuits 10, according to the average period to be had by the jittery signal. For example, in a case where a jittery signal is generated in which the average pulse width is set to 1/a of the pulse width of the reference signal, the selecting sections 12 select the reference signal CLK0 and the output signals CLK1 to CLK(a−1) of the delay circuits 10 and supplies the selected signals to the signal generating section 20.

Figure 4:
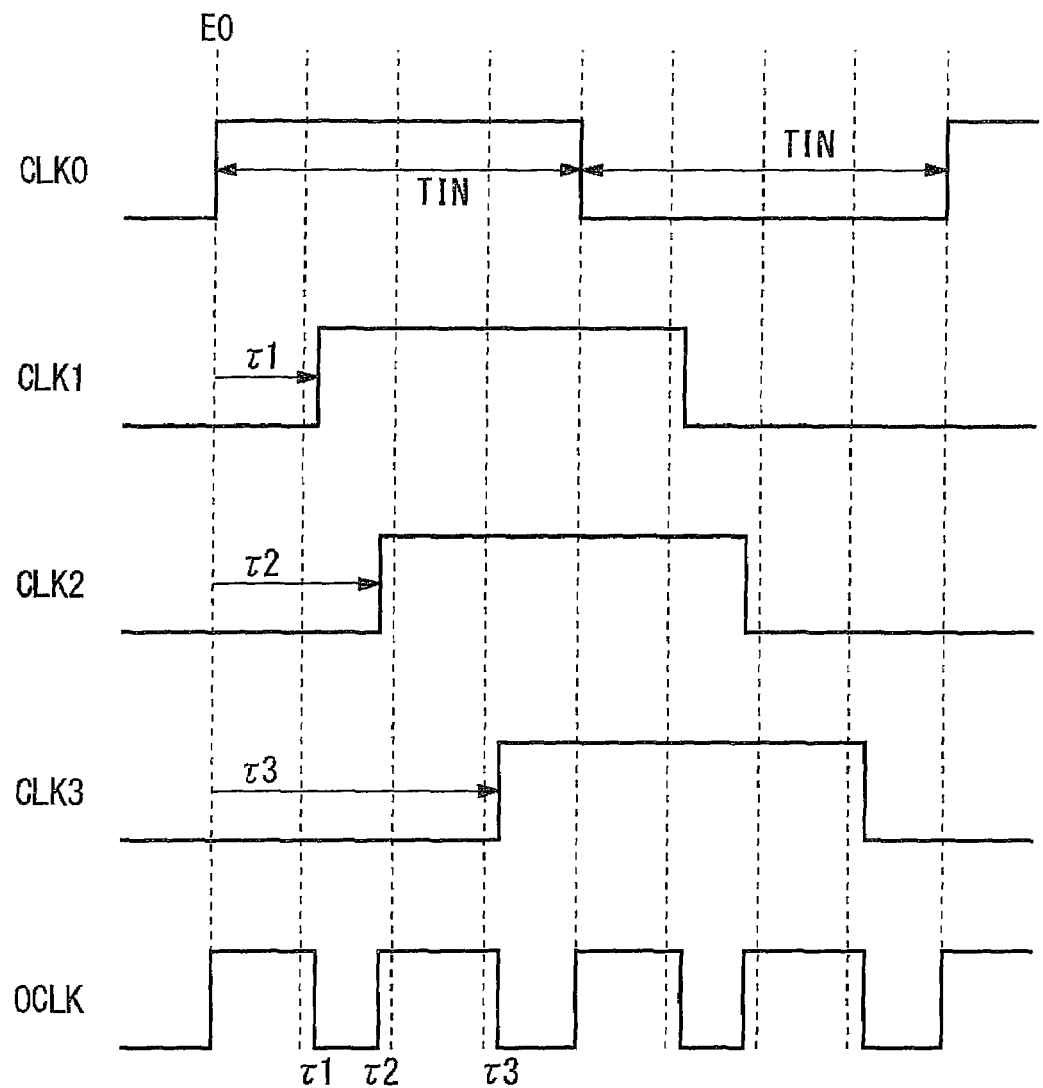
FIG. 4 is a timing chart showing an exemplary operation of the jitter injection circuit 100 shown in FIG. 3.

FIG. 4 is a timing chart showing an exemplary operation of the jitter injection circuit 100 shown in FIG. 3. The jitter injection circuit 100 of the present embodiment has an average period of $T_{IN}/4$ and generates a jittery signal in which the period of the injected jitter is $T_{IN}$. The reference period control section 40 controls the reference signal such that the period (pulse width) of the reference signal CLK0 becomes $T_{IN}$.

Furthermore, because a=4 in the present embodiment, the selecting sections 12 select the reference signal CLK0 and the output signals CLK1 to CLK3 of the delay circuits 10 and supplies the selected signals to the signal generating section 20. The delay setting section 30 sets for the first to third delay circuits 10 delay amounts τ1, τ2, τ3 obtained by adding or subtracting each jitter value corresponding to the jitter waveform to be injected to or from the an integer multiple of the average period $T_{IN}/4$ of the jittery signal. The jitter values according to the jitter waveform to be injected may be values obtained by sequentially sampling the jitter waveform having a period of $T_{IN}$ with a clock having a period of $T_{IN}/(n+1)$ (where n is the parallel number of the delay circuit 10). By using such settings, a jittery signal is generated having an average period of $T_{IN}/4$ and in which the period of the injected jitter is $T_{IN}$.

Figure 5:
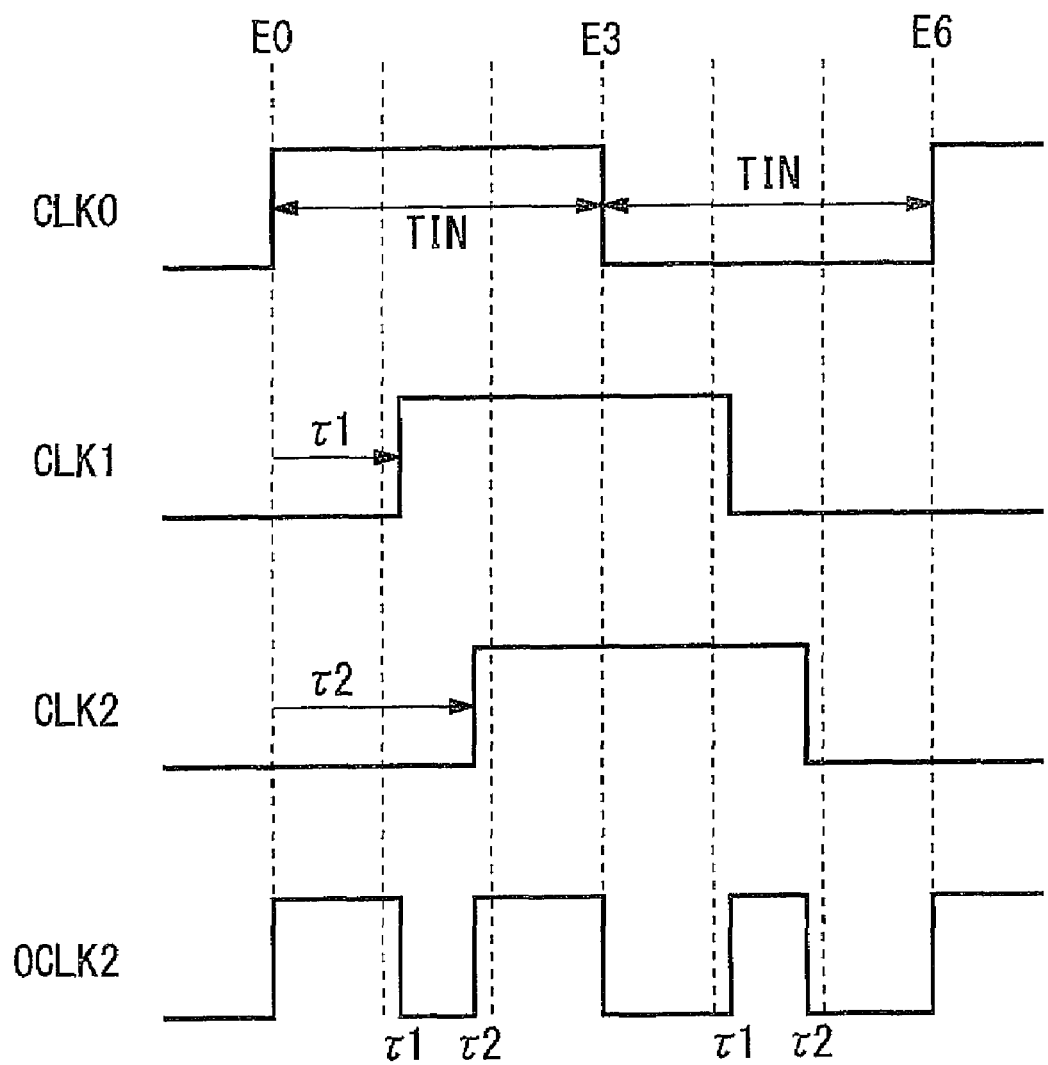
FIG. 5 is a timing chart showing another exemplary operation of the jitter injection circuit 100 shown in FIG. 3.

FIG. 5 is a timing chart showing another exemplary operation of the jitter injection circuit 100 shown in FIG. 3. In the example described in relation to FIG. 4, the selecting sections 12 supply an even number of signals to the signal generating section 20. The selecting sections 12 of the present embodiment supply an odd number of signals to the signal generating section 20.

In such a case, the waveform of the jittery signal corresponding to areas before and after the edge of the reference signal CLK0 is inverted. In the example shown in FIG. 5, the waveform of the jittery signal is inverted in the period from E0 to E3 in relation to the period E3 to E6. The selecting sections 12 may select an even number or an odd number of signals to supply to the signal generating section 20 depending on the intended use of the jittery signal.

Figure 6:
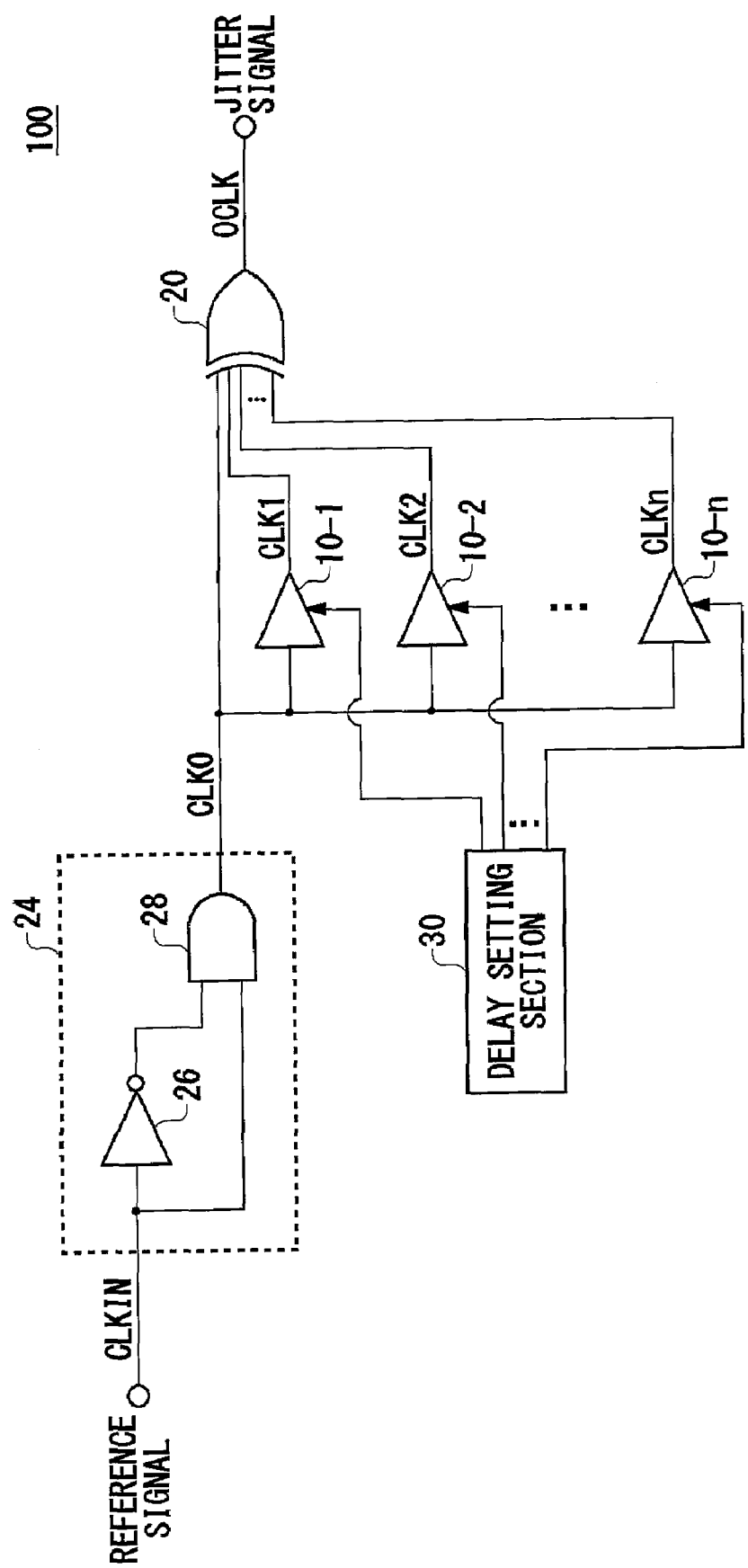
FIG. 6 shows another exemplary configuration of the jitter injection circuit 100.

FIG. 6 shows another exemplary configuration of the jitter injection circuit 100. The jitter injection circuit 100 according to the present embodiment is further provided with a pulse generating section 24 in addition to the configuration of any one of the jitter injection circuits 100 described in relation to FIGS. 1 to 5. FIG. 6 shows an example in which the pulse generating section 24 is added to the configuration of the jitter injection circuit 100 shown in FIG. 1.

The pulse generating section 24 receives the reference signal $CLK_{IN}$, generates a pulse having a prescribed pulse width for each rising edge of the reference signal $CLK_{IN}$, and outputs the generated pulse as the reference signal CLK0. The pulse generating section 24 supplies the reference signal CLK0 to the signal generating section 20 and the plurality of delay circuits 10 in parallel.

Figure 7:
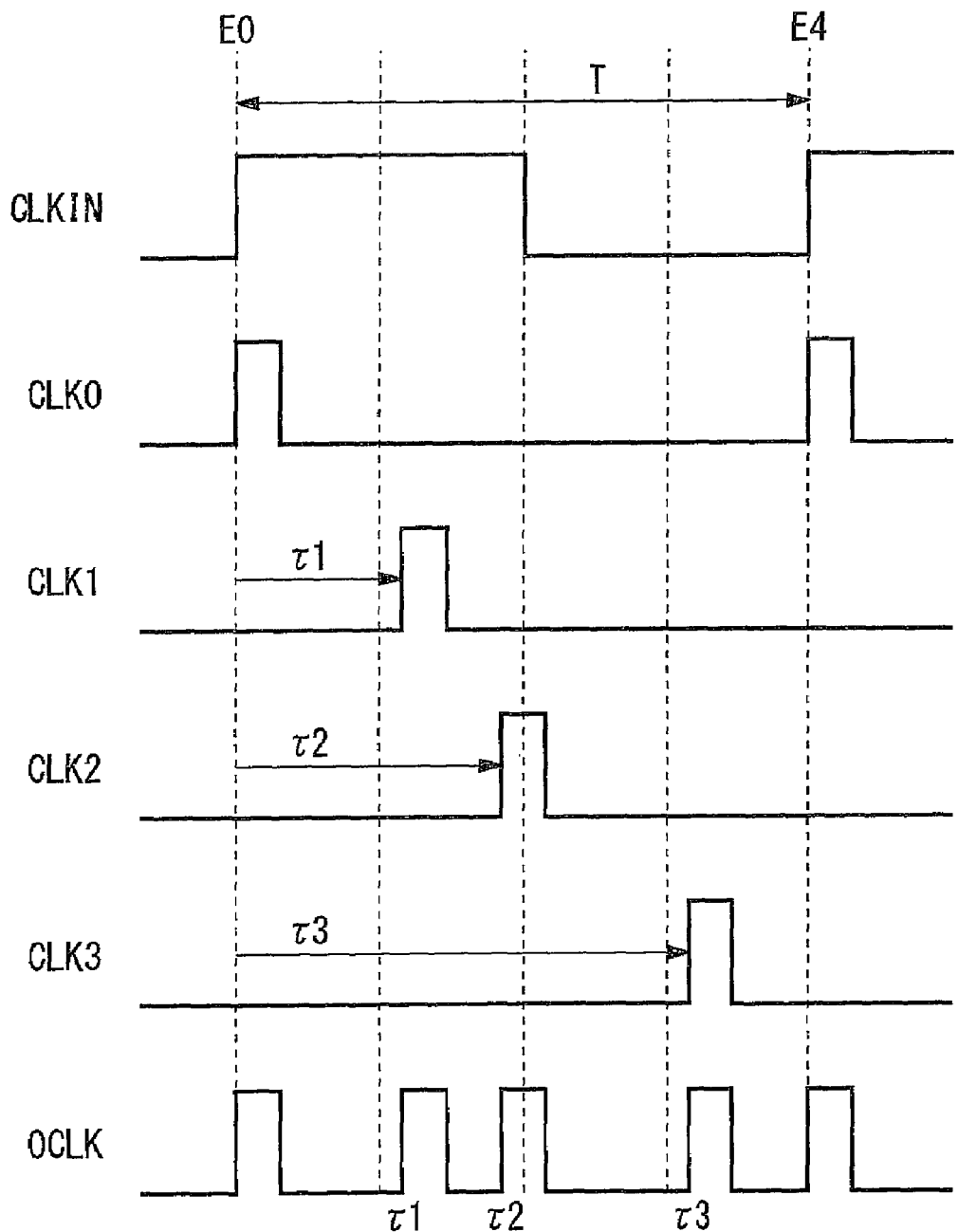
FIG. 7 is a timing chart showing an exemplary operation of the jitter injection circuit 100 shown in FIG. 6.

FIG. 7 is a timing chart showing an exemplary operation of the jitter injection circuit 100 shown in FIG. 6. As described above, the pulse generating section 24 outputs the pulse having the prescribed pulse width for each rising edge of the reference signal $CLK_{IN}$. It is desirable that the pulse width be less than the maximum delay amount set for the plurality of delay circuits 10.

Each delay circuit 10 receives the pulse output by the pulse generating section 24, delays the received pulse by the delay amount τk set for each delay circuit 10, and outputs the thus delayed pulse. By doing this, a jitter signal can be easily generated in which timing pulses are arranges according to the delay amounts of the plurality of delay circuits 10, as shown in FIG. 7.

The signal generating section 20 of the present embodiment may be an OR circuit that outputs an OR of the plurality of input signals. The OR of the plurality of input signals may be a signal that is logic H when one of the plurality of input signals indicates logic H and is logic L when all of the input signals indicate logic L. Because the delay setting section 30 sets in advance a delay amount according to the timing jitter waveform to be injected for each delay circuit 10, timing jitter can be injected at each edge of the jittery signal.

Furthermore, the jitter injection circuit 100 may be further provided with an input switching section that switches between inputting the reference signal $CLK_{IN}$ and inputting the pulse generated by the pulse generating section 24 to the plurality of delay circuits 10 and the signal generating section 20. By using such a configuration, a selection can be made as to whether the jitter injection circuit 100 is made to operate as described in relation to FIGS. 1 to 5 or made to operate as described in relation to FIGS. 6 and 7.

Figure 8:
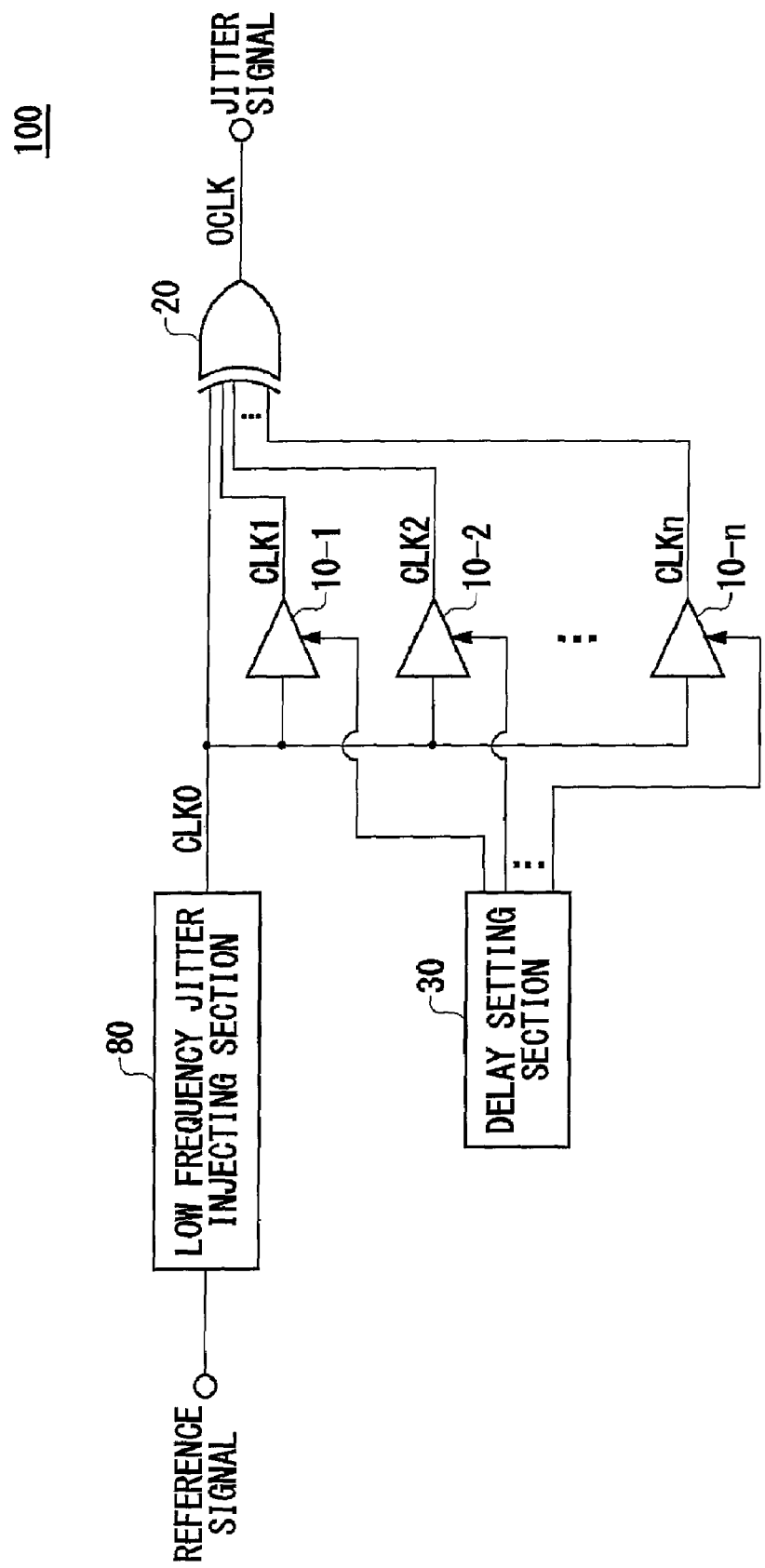
FIG. 8 shows another exemplary configuration of the jitter injection circuit 100.

FIG. 8 shows another exemplary configuration of the jitter injection circuit 100. The jitter injection circuit 100 of the present embodiment is further provided with a low frequency jitter injecting section 80 in addition to the configuration of any one of the jitter injection circuits 100 described in relation to FIGS. 1 to 7. In FIG. 8, the low frequency jitter injecting section 80 is added to the configuration of the jitter injection circuit 100 shown in FIG. 1.

The low frequency jitter injecting section 80 injects into the reference signal jitter that has a frequency lower than a frequency of the jitter generated by the plurality of delay circuits 10 and the signal generating section 20, and inputs the thus achieved signal into the plurality of delay circuits 10 and the signal generating section 20. The low frequency jitter injecting section 80 may, for example, inject the low frequency jitter into the reference signal using a variable delay circuit in which the delay amount changes dynamically.

Figure 9:
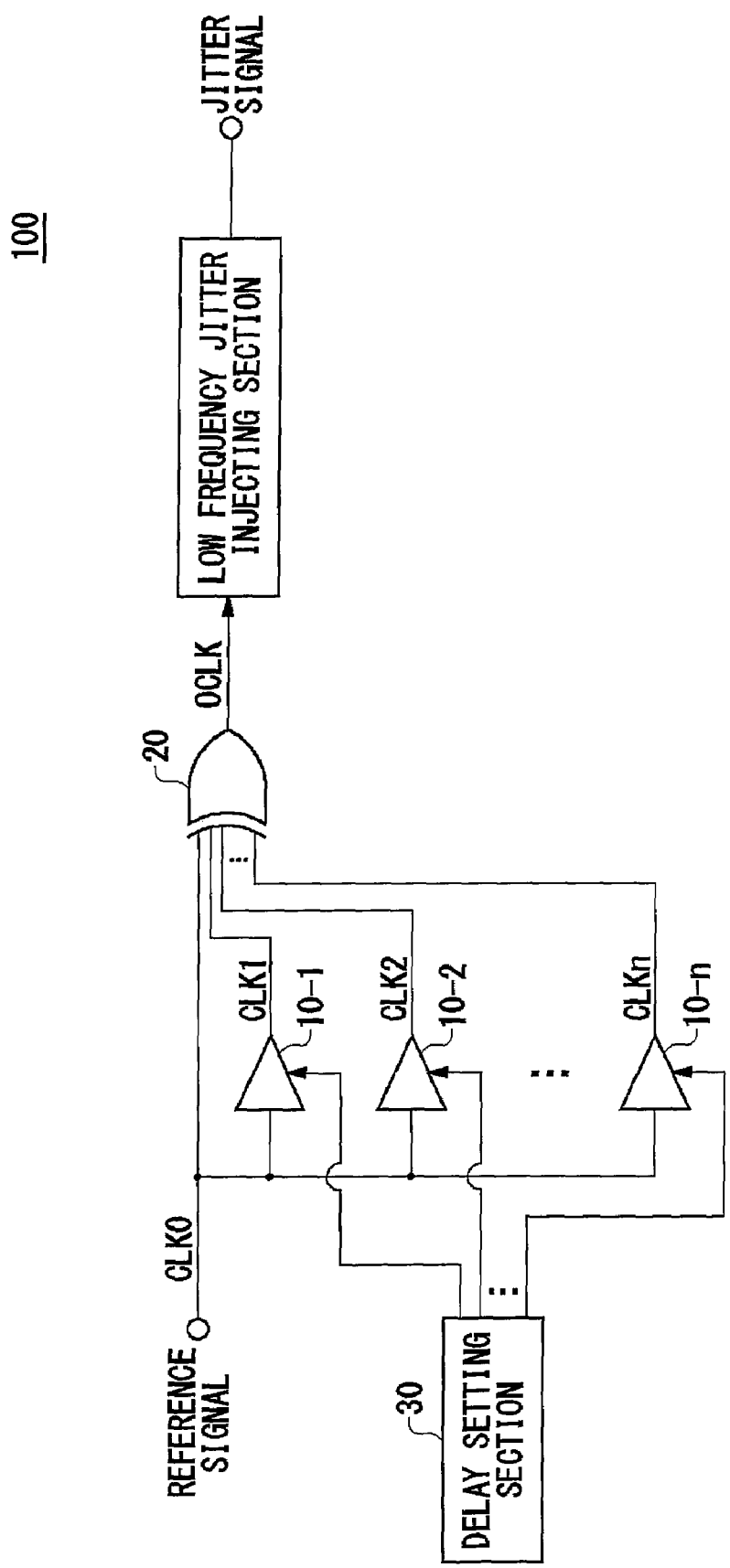
FIG. 9 shows another exemplary configuration of the jitter injection circuit 100.

FIG. 9 shows another exemplary configuration of the jitter injection circuit 100. The jitter injection circuit 100 of the present embodiment is further provided with a low frequency jitter injecting section 80 in addition to the configuration of any one of the jitter injection circuits 100 described in relation to FIGS. 1 to 7. In FIG. 9, the low frequency jitter injecting section 80 is added to the configuration of the jitter injection circuit 100 shown in FIG. 1.

The low frequency jitter injecting section 80 of the present embodiment further injects the low frequency jitter described in relation to FIG. 8 into the jittery signal output by the signal generating section 20. By using the configurations described above, jitter having a wide bandwidth can be generated easily. Instead of providing the low frequency jitter injecting section 80, the delay setting section 30 may change the delay amount of each delay circuit 10 by a frequency sufficiently lower than the frequency of the reference signal.

Figure 10:
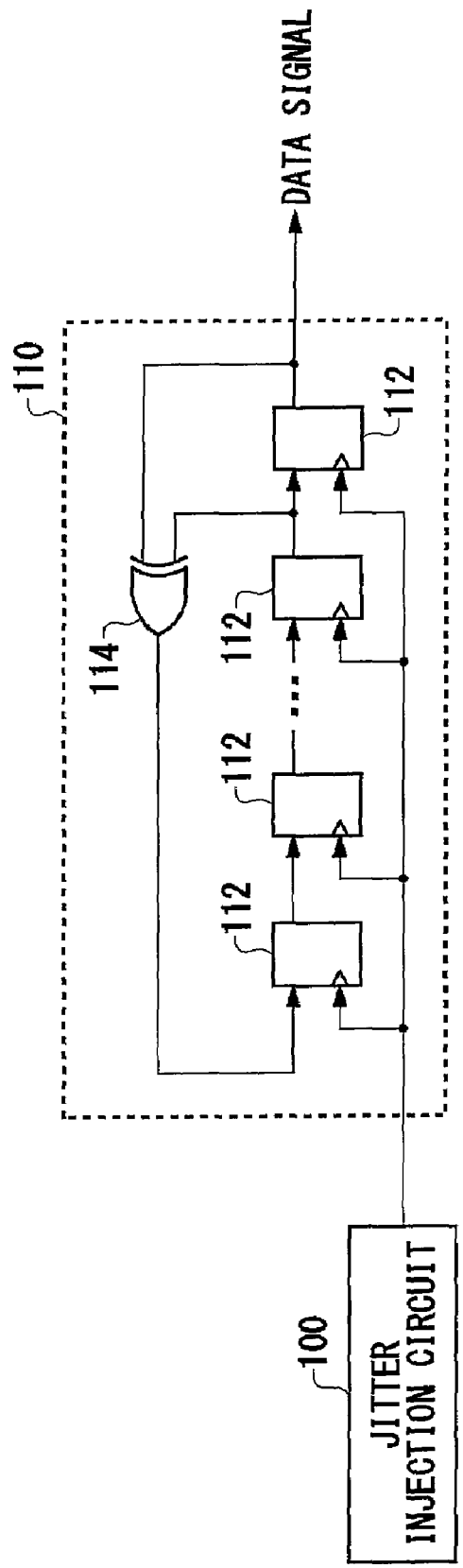
FIG. 10 shows an exemplary configuration of a data jitter injection circuit 200 according to an embodiment.

FIG. 10 shows an exemplary configuration of a data jitter injection circuit 200 according to an embodiment. The data jitter injection circuit 200 is a circuit that injects jitter into a data signal and is provided with the jitter injection circuit 100 and a data jitter injecting section 110.

The jitter injection circuit 100 may be the same as any one of the jitter injection circuits 100 described in relation to FIGS. 1 to 9. The data jitter injecting section 110 receives the jittery signal from the jitter injection circuit 100 and generates a data signal having a bit boundary designated by each edge timing of the jittery signal. Through such a configuration, data jitter can be injected into the data signal.

The data jitter injecting section 110 of the present embodiment is a LFSR (Linear Feedback Shift Register) that includes a plurality of flip-flops 112 and exclusive OR circuits 114. The plurality of flip-flops 112 are connected in a cascading manner and commonly receive the jittery signal. Each flip-flop 112 acquires input data according to one or both of the rising edge and the falling edge of the jittery signal and supplies the acquired data to the flip-flop 112 at a stage immediately thereafter.

The exclusive OR circuits 114 generate an exclusive OR of the output signals from two of the flip-flops 112 selected according to a generator polynomial of the LFSR and supply the exclusive OR to the first stage flip-flop 112. By using such a configuration, PRBS (Pseudo-Random Binary Sequence) data into which jitter is injected can be generated.

Figure 11:
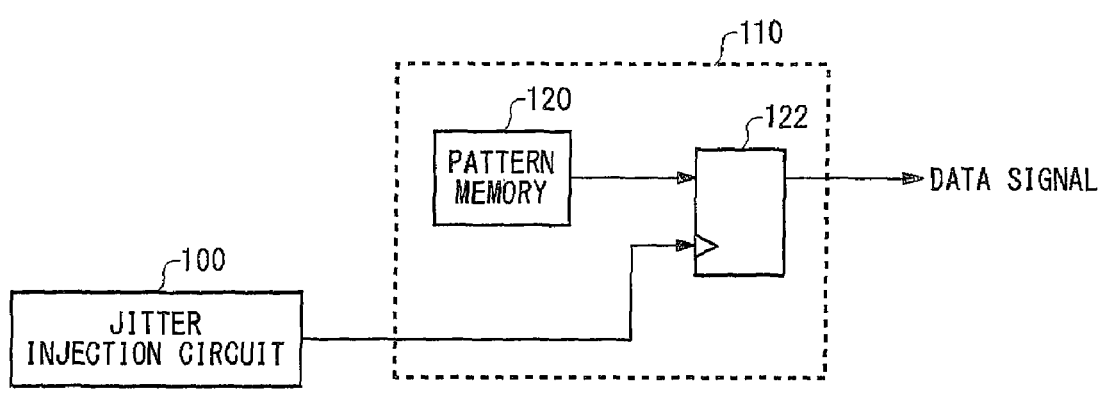
FIG. 11 shows another exemplary configuration of the data jitter injecting section 110.

FIG. 11 shows another exemplary configuration of the data jitter injecting section 110. The data jitter injecting section 110 of the present embodiment includes a pattern memory 120 and a flip-flop 122. The pattern memory 120 stores thereon in advance a logic pattern to be included in the data signal.

The flip-flop 122 acquires the logic pattern stored in the pattern memory 120 according to one or both of the rising edge and the falling edge of the jittery signal supplied from the jitter injection circuit 100 and outputs the acquired logic pattern. By using such a configuration, the jitter can be injected into a data signal having any arbitrary logic value pattern.

Instead of the configurations shown in FIGS. 10 and 11, the data signal into which the jitter is injected can be generated using any one of the jitter injection circuits 100 described in relation to FIGS. 1 to 9.

Figure 12:
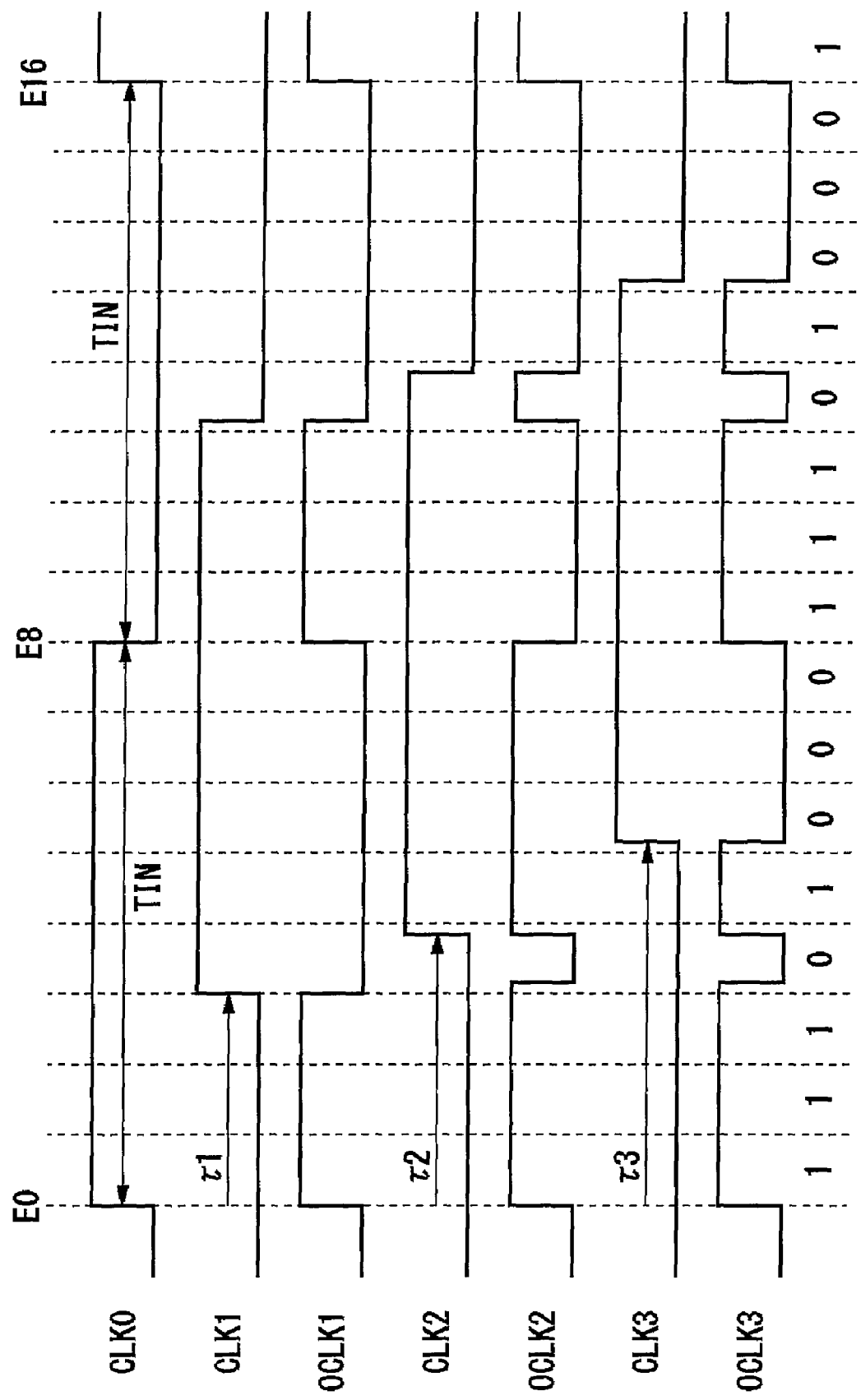
FIG. 12 is a timing chart showing an exemplary operation of the jitter injection circuit 100 that injects jitter into a data signal.

FIG. 12 is a timing chart showing an exemplary operation of a jitter injection circuit 100 that injects jitter into a data signal. In the present embodiment, an example is described in which the jitter is injected into a data signal in which the logic pattern "11101000" is repeated. In this case, the reference period control section 40 may generate a reference signal having a period substantially equal to a value obtained by multiplying the number of bits in the repeating logic pattern by the time of a single bit of the data signal.

The selecting sections 12 supply to the signal generating section 20 a number of signals equal to the number of times the logic value shifts in the repeating logic pattern "11101000." In the present embodiment, because the logic value changes three times in the repeating logic pattern "11101000," the selecting sections 12 select the reference signal CLK0 and the output signals CLK1 to CLK3 and supplies the selected signals to the signal generating section 20.

The delay setting section 30 sets the delay amount for each delay circuit 10 based on the number of consecutive bits having the same logic value in the logic value pattern to be included in the jittery signal. For example, in the repeating logic pattern "11101000" to be included in the jittery signal of the present embodiment, the first logic value "1" is consecutive for three bits. Therefore, the delay setting section 30 sets as the delay amount $\tau 1$ of the first delay circuit 10-1 a value obtained by adding or subtracting the jitter value to be injected to or from a time of three bit units (three times the average period of the jittery signal) in the jittery signal.

Next in the logic pattern "11101000" is one bit having a logic value of zero. Therefore, the delay setting section 30 sets as the delay amount $\tau 2$ of the second delay circuit 10-2 a value obtained by adding or subtracting the jitter value to be injected to or from an OR of the delay amount $\tau 1$ and the time of one bit unit in the jittery signal.

In the same manner, the delay setting section 30 sets as the delay amount $\tau 3$ of the third stage delay circuit 10-3 a value obtained by adding or subtracting the jitter value to be injected to or from an OR of the of the delay amount $\tau 2$ and a time of one bit unit in the jittery signal. Through such a process, a data signal can be generated into which jitter is injected by using the jitter injection circuit 100.

Figure 13:
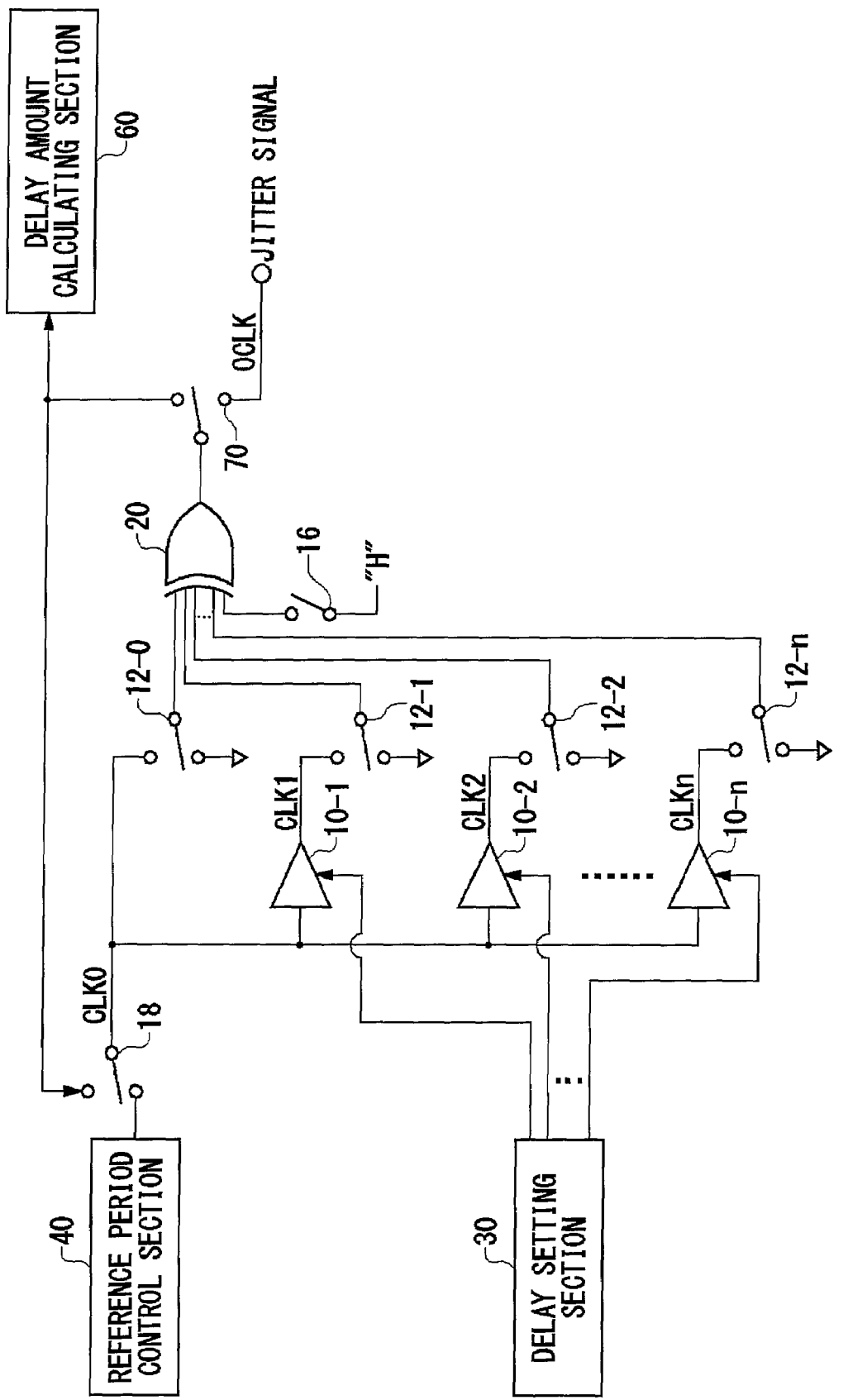
FIG. 13 shows another exemplary configuration of the jitter injection circuit 100.

FIG. 13 shows another exemplary configuration of the jitter injection circuit 100. The jitter injection circuit 100 of the present embodiment is further provided with a delay amount calculating section 60, a switching section 70, a switch 16, and a switch 18 in addition to the configuration of any one of the jitter injection circuits 100 described in relation to FIGS. 1 to 12, and measures the delay amount of each delay circuit 10. FIG. 13 shows a configuration in which the jitter injection circuit 100 described in relation to FIG. 3 is provided with the delay amount calculating section 60, the switching section 70, the switch 16, and the switch 18.

During measuring of the delay amount of each delay circuit 10, the switching section 70 switches the transmission path of the output signal of each delay circuit 10 such that the signal forms a loop that returns to the input of the delay circuit 10. In the present embodiment, the switching section 70 operates together with the switch 18 and the selecting sections 12 disposed to correspond to each delay circuit 10 to form the loop.

In a case where the switching section 70 of the present embodiment is disposed at a stage after the signal generating section 20 to measure the delay amount of each delay circuit 10, the signal output by the signal generating section 20 is input to each delay circuit 10 via the switch 18. A loop is formed in which the output signal of a delay circuit 10 whose delay amount is to be measured is fed back to the input of the same delay circuit 10 because the corresponding selecting section 12 supplies to the signal generating section 20 the output signal of the delay circuit 10 and does not supply to the signal generating section 20 the output signals of other delay circuits 10.

The switch 18 selects whether the reference signal or a feedback signal from the switching section 70 is supplied to each delay circuit 10. The switch 18 selects the reference signal when the jittery signal is generated and selects the feedback signal when the delay amount of each delay circuit 10 is being measured.

The switch 16 supplies a logic value H to one of the inputs of the signal generating section 20 when the delay amount of each delay circuit 10 is measured. By doing this, the logic value H and the signal from the delay circuit 10 to be measured are input to the signal generating section 20. In other words, when the delay amount of each delay circuit 10 is measured, the signal generating section 20 inverts the signal from the delay circuit 10 to be measured and outputs the thus inverted signal.

The delay amount calculating section 60 calculates the delay amount of a given delay circuit 10 based on the period of the signal transmitted in the loop formed by the switching section 70, the switch 18, the delay circuit 10 to be measured, the selecting section 12, and the signal generating section 20. For example, the delay amount calculating section 60 may measure the period of the signal transmitted from the third switching section 70-3 to the first switching section 70-1. Furthermore, the delay amount calculating section 60 may input a single pulse into the loop to measure the period in which the pulse circles through the loop. The thus measured period corresponds to the delay amount in the delay circuit 10.

The delay setting section 30 sets the delay amount in each delay circuit 10 further based on the delay amounts calculated by the delay amount calculating section 60. The selecting sections 12 may sequentially select the output signals of each delay circuit 10, and the delay amount calculating section 60 may sequentially measure the delay amounts of each delay circuit 10. Through such a configuration, the waveform of the jitter to be injected into the jittery signal can be accurately adjusted.

Figure 14:
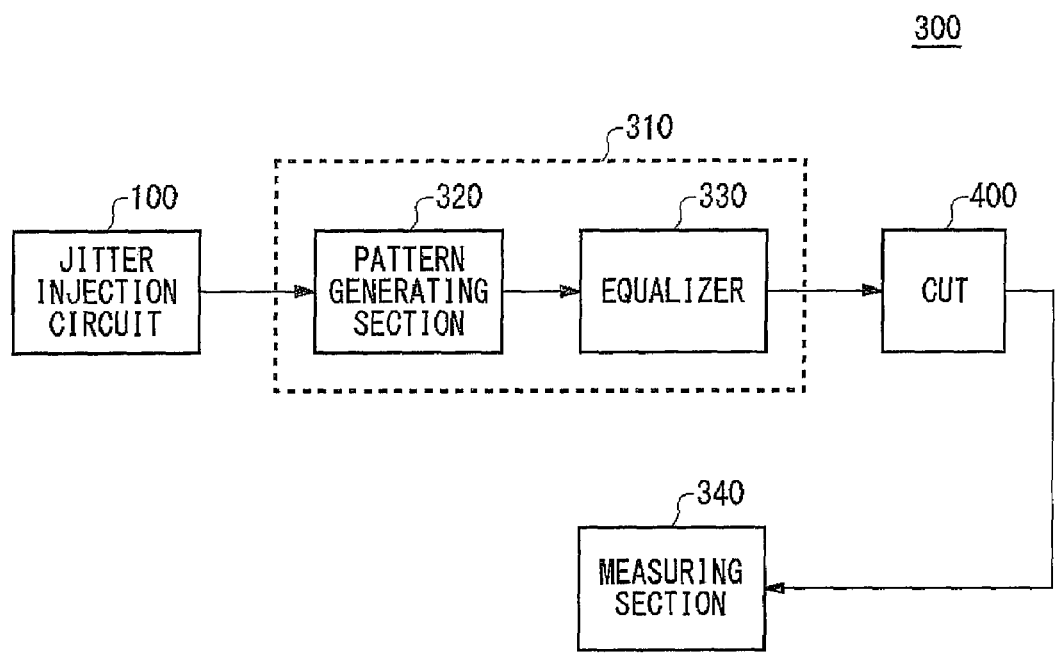
FIG. 14 shows an exemplary configuration of a test apparatus 300 according to an embodiment together with a device under test 400.

FIG. 14 shows an exemplary configuration of a test apparatus 300 according to an embodiment coupled with a device under test 400. The test apparatus 300 is an apparatus that tests the device under test 400, such as a semiconductor circuit, and is provided with the jitter injection circuit 100, a test signal generating section 310, and a measuring section 340.

The jitter injection circuit 100 may be the same as any one of the jitter injection circuits 100 described in relation to FIGS. 1 to 13. As described above, the jitter injection circuit 100 can generate a jittery signal that includes high frequency jitter.

The test signal generating section 310 generates a test signal based on the jittery signal and supplies the generated test signal to the device under test 400. For example, the test signal generating section 310 may use the jittery signal as a clock to generate the test signal. The test signal generating section 310 of the present embodiment includes a pattern generating section 320 and an equalizer 330.

The pattern generating section 320 includes a predetermined logic pattern and generates a test signal that has a bit boundary designated by each edge of the jittery signal. Through such a configuration, a test signal including high frequency jitter can be generated. The equalizer 330 compensates the waveform of the test signal in advance according to transmission loss between the test signal generating section 310 and the device under test 400.

The measuring section 340 makes a judgment concerning pass/fail of the device under test 400 by measuring a response signal output by the device under test 400 in response to the test signal. For example, the measuring section 340 may make a judgment concerning pass/fail of the device under test 400 based on whether the logic pattern of the response signal matches a prescribed expected value pattern.

The jitter tolerance of the device under test 400 can be tested by adjusting the frequency and amplitude of the jitter generated by the jitter injection circuit 100. For example, the test apparatus 300 can test whether the device under test 400 fulfills the jitter tolerance specifications by causing the jitter injection circuit 100 to generate jitter having a frequency and amplitude designated by the jitter tolerance specifications of the device under test 400. The device under test 400 can be tested using a test signal that includes high frequency jitter.

Figure 15:
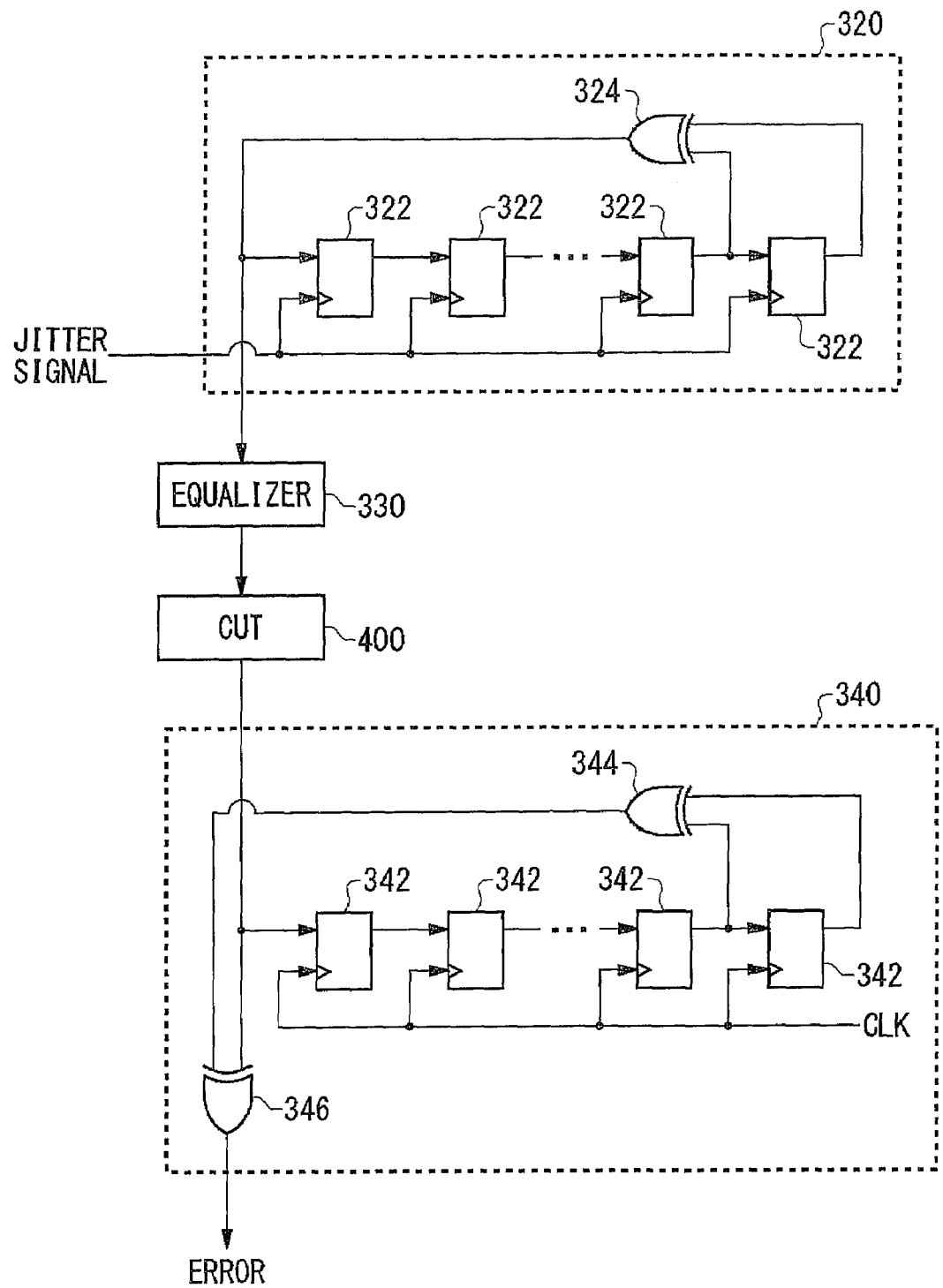
FIG. 15 shows an exemplary configuration of a pattern generating section 320 and a measuring section 340.

FIG. 15 shows exemplary configurations of the pattern generating section 320 and the measuring section 340. The pattern generating section 320 of the present embodiment generates a test signal that includes a PRBS (Pseudo-Random Binary Sequence) logic pattern by using an LFSR (Linear Feedback Shift Register). The pattern generating section 320 includes a plurality of flip-flops 322 and an exclusive OR circuit 324.

Each flip-flop 322 receives the jittery signal from the jitter injection circuit 100 in parallel, acquires the signal output by the flip-flop 322 at the stage immediately prior according to each edge of the jittery signal, and outputs the acquired signal. The first stage flip-flop 322 acquires the signal output by the exclusive OR circuit 324 according to the jittery signal. In a case where the jitter injection circuit 100 is provided with the pulse generating section 24 as described in relation to FIG. 6, each flip-flop 322 may operate according to a rising edge of the jittery signal.

The exclusive OR circuit 324 outputs as the test signal an exclusive OR of the signals output by the flip-flops 322 selected according to a generator polynomial of the LFSR. By using such a configuration, a PRBS test signal having jitter according to the jittery signal can be generated.

The measuring section 340 generates the expected value pattern using the LFSR having the same configuration as that of the pattern generating section 320. The measuring section 340 includes a plurality of flip-flops 342, an exclusive OR circuit 344, and a comparing section 346.

The plurality of flip-flops 342 and the exclusive OR circuit 344 may have the same function and configuration as the plurality of flip-flops 322 and the exclusive OR circuit 324. However, each flip-flop 342 operates according to a clock signal into which jitter is not injected. Furthermore, the first stage flip-flop 342 acquires the response signal of the device under test 400 according to the clock signal. By using such a configuration, the exclusive OR circuit 344 can sequentially generate the logic values to be indicated by the response signal of the device under test 400.

The comparing section 346 compares the logic value of the response signal of the device under test 400 to the logic value of the signal output by the exclusive OR circuit 344 and outputs an error signal that indicates whether the aforementioned logic values match. Furthermore, the bit error ratio of the device under test 400 may be measured by measuring a rate at which non-matching logic values occur with the comparing section 346.

Figure 16:
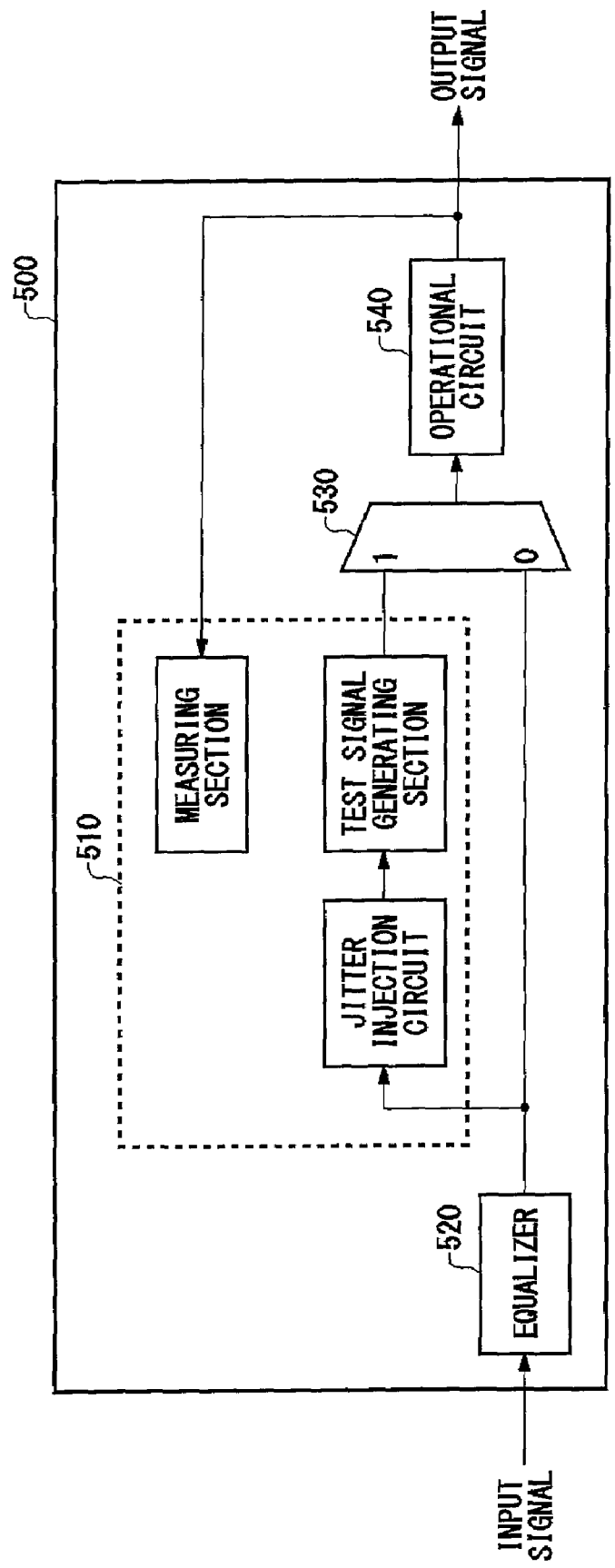
FIG. 16 shows an exemplary configuration of an electronic device 500 according to an embodiment.

FIG. 16 shows an exemplary configuration according to an electronic device 500 of an embodiment. The electronic device 500 may be a device such as a semiconductor chip that outputs an output signal in response to an input signal, for example. The electronic device 500 is provided with an equalizer 520, a self diagnostic section 510, a multiplexer 530, and a performance circuit 540.

The equalizer 520 compensates the waveform of the input signal according to signal loss in the transmission path of the input signal. The multiplexer 530 selects the input signal and supplies the selected signal to the performance circuit 540 when the electronic device 500 is operating normally.

The self diagnostic section 510 tests the performance circuit 540 when the electronic device 500 performs a self diagnosis. The self diagnostic section 510 includes the jitter injection circuit 100, the test signal generating section 310, and the measuring section 340. The jitter injection circuit 100, the test signal generating section 310, and the measuring section 340 may have the same function and configuration as the elements described using the same reference numerals in FIG. 14. The jitter injection circuit 100 may receive an input signal supplied from the outside as the reference signal.

The multiplexer 530 selects the test signal generated by the self diagnostic section 510 and supplies the selected test signal to the performance circuit 540 when the electronic device 500 performs the self diagnosis. The measuring section 340 makes a judgment concerning pass/fail of the performance circuit 540 based on the response signal of the performance circuit 540.

Through the configuration described above, the electronic device 500 performs a self diagnostic to determine pass/fail of the performance circuit 540. Furthermore, because high frequency jitter can be generated by the jitter injection circuit 100, the electronic device 500 can test the performance circuit 540 using the test signal that contains the high frequency jitter.

Figure 17:
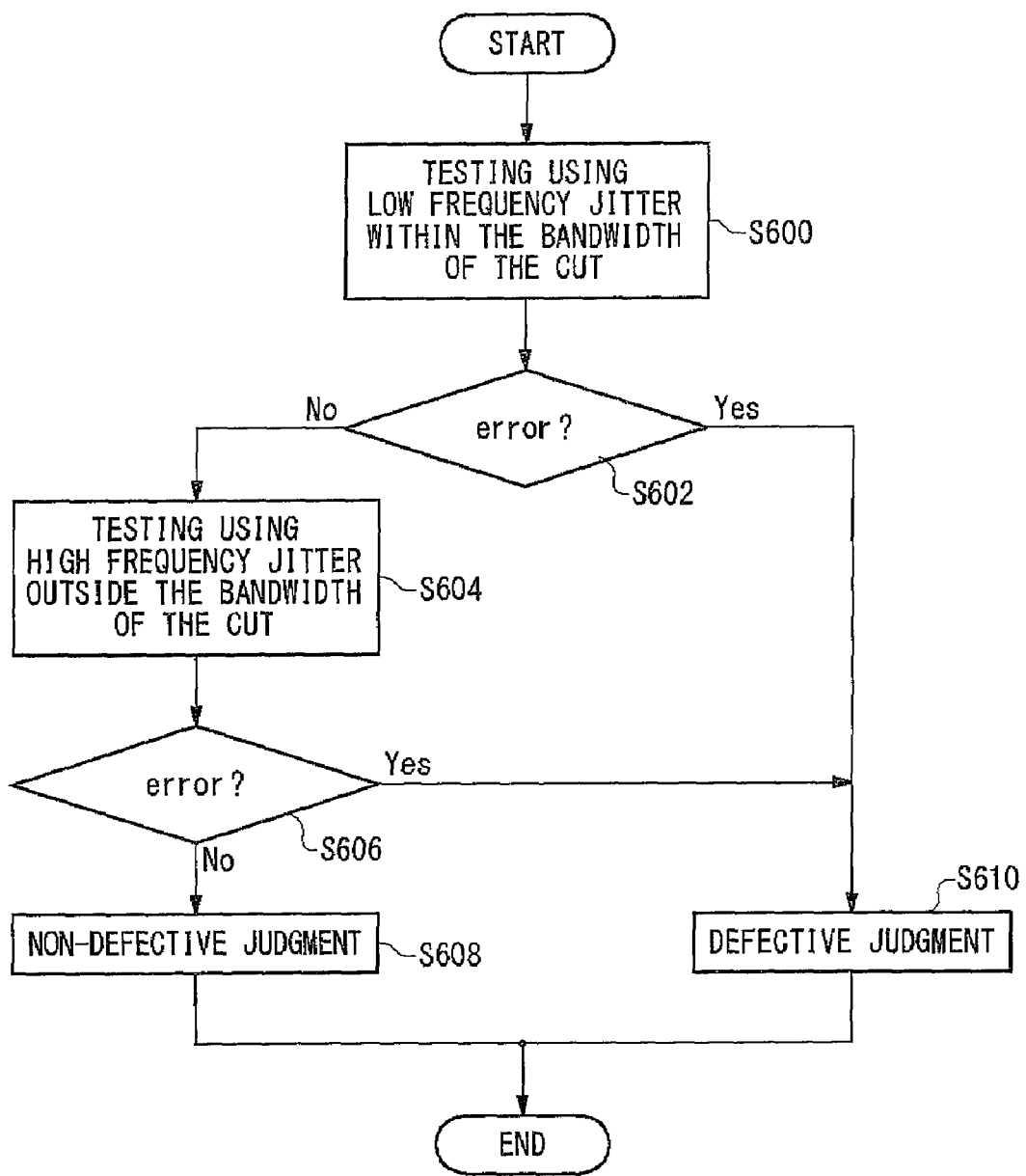
FIG. 17 is a flow chart showing an exemplary operation of the test apparatus 300.

FIG. 17 is a flow chart showing an exemplary operation of the test apparatus 300. The test apparatus 300 of the present embodiment performs a test in which low frequency jitter within an operational bandwidth of the device under test 400 is used and a test in which high frequency jitter outside the operational bandwidth of the device under test 400 is used.

First, the test apparatus 300 tests the device under test 400 using the low frequency jitter within the operational bandwidth of the device under test 400 (S600). In this case, the jitter injection circuit 100 generates a first jittery signal into which is injected jitter that includes the frequency that is within the operational bandwidth of the device under test 400. For example, in a case where the device under test 400 includes a PLL circuit, the jitter injection circuit 100 generates a jittery signal that includes jitter having a frequency within the loop bandwidth of the PLL circuit.

The test signal generating section 310 supplies the first test signal corresponding to the first jittery signal to the device under test 400. Next, the measuring section 340 makes a judgment concerning pass/fail of the device under test 400 based on a first response signal output by the device under test 400 in response to the first test signal. More specifically, the measuring section 340 makes a judgment as to whether a bit error occurs in the first response signal (S602). In a case where a bit error occurs, the measuring section 340 determines that the device under test 400 is a defective product (S610) and ends the testing.

In a case where the bit error does not occur in the low frequency jitter test so that the device under test 400 is determined to be non-defective, the test apparatus 300 tests the device under test using the high frequency jitter outside the operational bandwidth of the device under test 400 (S604). In this case, the jitter injection circuit 100 generates a second jittery signal that includes jitter having a frequency outside the operational bandwidth of the device under test 400. In other words, the jitter injection circuit 100 sequentially generates the first jittery signal and the second jittery signal.

The test signal generating section 310 supplies the second test signal corresponding to the second jittery signal to the device under test 400. Next, the measuring section 340 makes a judgment concerning pass/fail of the device under test 400 based on a second response signal output by the device under test 400 in response to the second test signal. More specifically, the measuring section 340 makes a judgment as to whether a bit error occurs in the response signal of the device under test 400 (S606). In a case where a bit error occurs, the measuring section 340 determines that the device under test 400 is a defective product (S610) and ends the testing. In a case where a bit error does not occur, the measuring section 340 judges the device under test 400 to be non-defective (S608) and ends the testing.

In the manner described above, the test apparatus 300 can easily perform testing of jitter tolerance outside of the operational bandwidth of the device under test 400 because the test apparatus 300 can easily generate high frequency jitter. Therefore, the test apparatus 300 can accurately determine pass/fail of the device under test 400.

Figure 18:
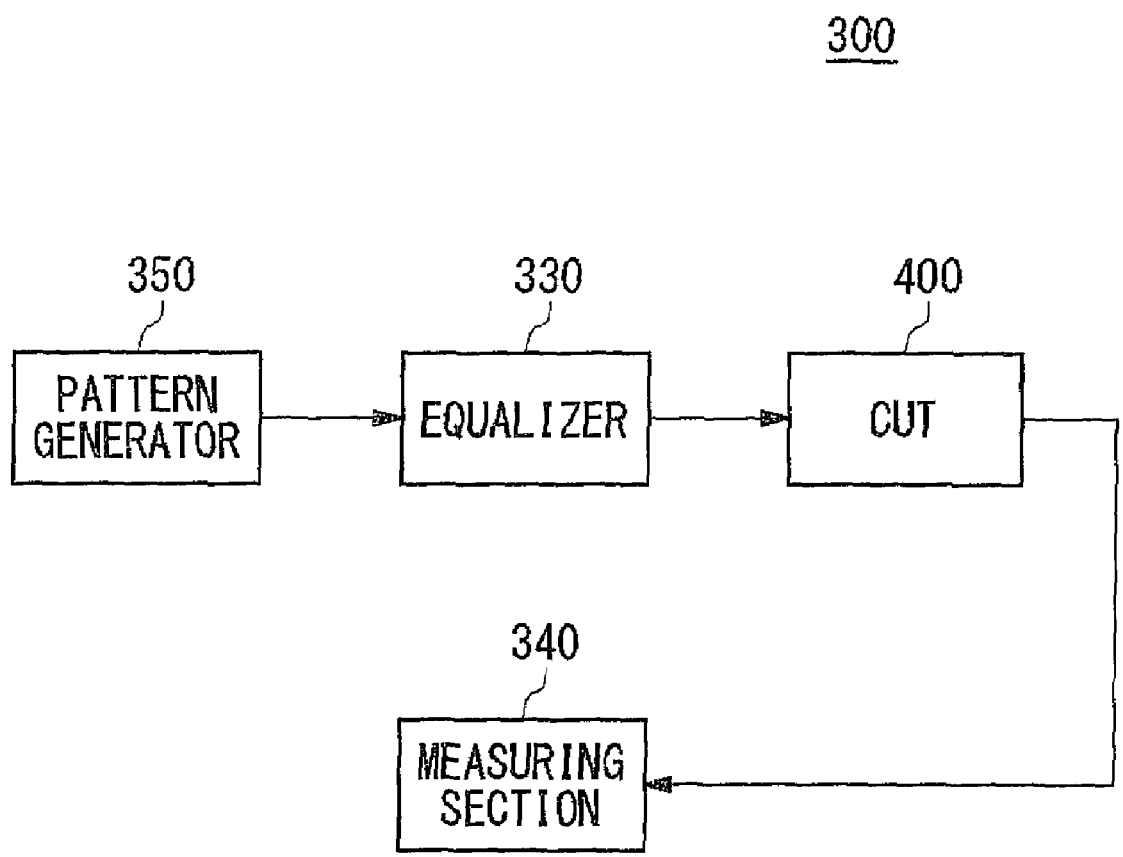
FIG. 18 shows another exemplary configuration of the test apparatus 300.

FIG. 18 shows another exemplary configuration of the test apparatus 300. The test apparatus 300 of the present embodiment is provided with a pattern generator 350, the equalizer 330, and the measuring section 340. The equalizer 330 may be the same as the equalizer 330 described in relation to FIG. 14. The measuring section 340 measures the response signal of the device under test 400 to make a judgment concerning pass/fail of the device under test 400.

The pattern generator 350 generates a test signal that includes both jitter and a predetermined logic pattern and supplies the generated test signal to the device under test 400. The pattern generator 350 may be included in the jitter injection circuit 100 described in relation to FIG. 12 and may output the data signal generated by the jitter injection circuit 100 as the test signal.

Figure 19:
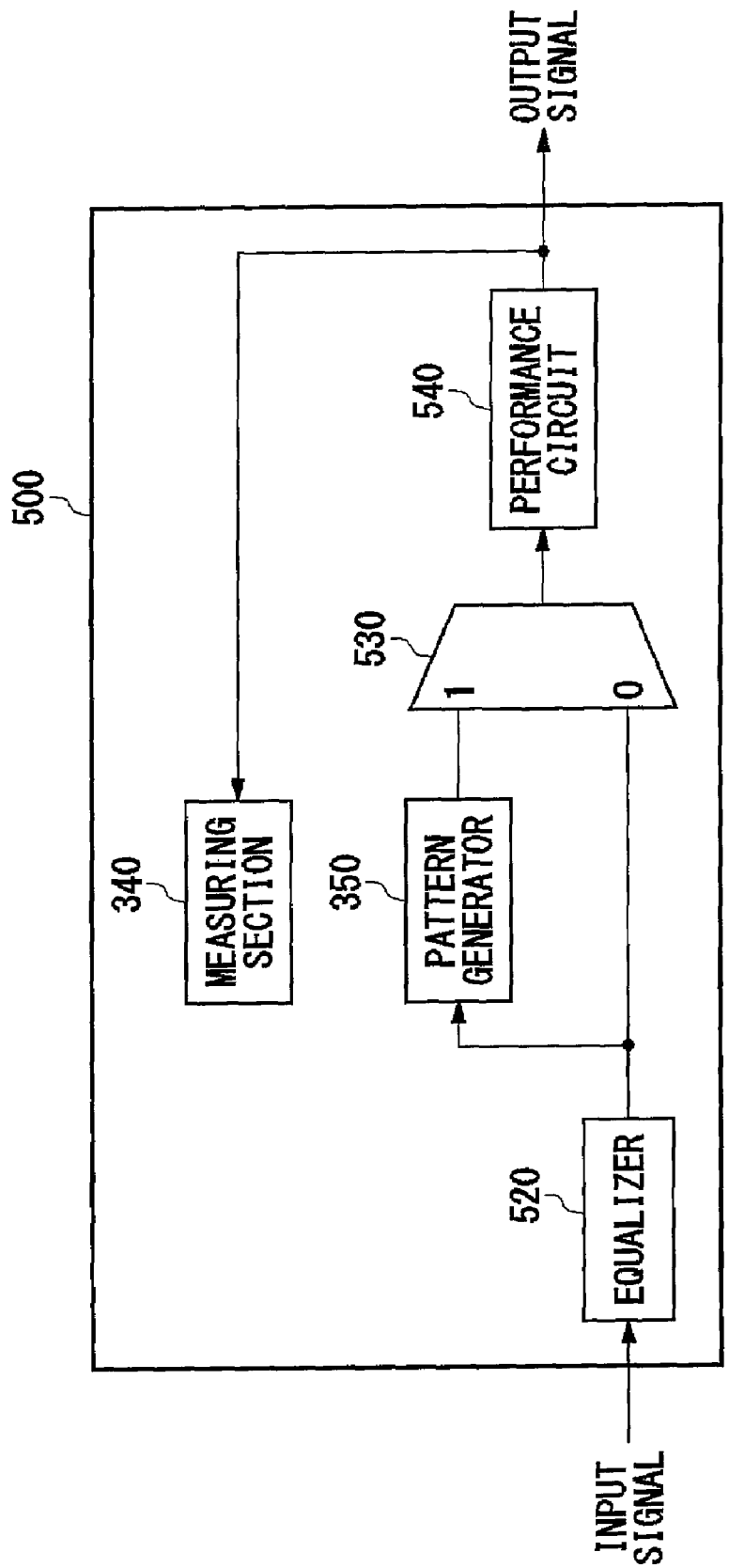
FIG. 19 shows another exemplary configuration of the electronic device 500.

FIG. 19 shows another exemplary configuration of the electronic device 500. The electronic device 500 of the present embodiment is provided with the equalizer 520, the pattern generator 350, the measuring section 340, the multiplexer 530, and the performance circuit 540. The equalizer 520, the multiplexer 530, and the performance circuit 540 may be the same as the equalizer 520, the multiplexer 530, and the performance circuit 540 described in relation to FIG. 16.

The pattern generator 350 and the measuring section 340 may be the same as the pattern generator 350 and the measuring section 340 described in relation to FIG. 18. Furthermore, the pattern generator 350 may receive the reference signal from the outside.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, by using the embodiments of the present invention, a jittery signal that includes high frequency period jitter can be easily generated. Furthermore, by testing a device under test or a performance circuit using the jittery signal, pass/fail of the device under test or the performance circuit can be accurately determined.

What is claimed is:

1. A jitter injection circuit that generates a jittery signal including jitter, comprising:
    a plurality of delay circuits that receive a supplied reference signal in parallel and that each delay the received reference signal by a preset delay amount, wherein the plurality of delay circuits are disposed to correspond to the plurality of edges of the jittery signal generated in the single bit of the reference signal, and
    a signal generating section that generates each edge of the jittery signal according to a timing of the signal output by each delay circuit, wherein the delay amount of at least one delay circuit is set to be a value different from an integer multiple of an average period to be included in the jittery signal, and wherein the signal generating section generates a plurality of edges of the jittery signal to generate a plurality of bits of the jittery signal for each single bit of the reference;

a delay setting section that sets for each delay circuit the delay amount according to the jitter to be injected at each edge of the jittery signal, wherein a maximum delay amount from among the delay amounts generated by the plurality of delay circuits is less than the single bit of the reference signal, and wherein the delay setting section sets for each delay circuit a delay amount obtained by adding timing jitter to be included in the corresponding bits of the jittery signal to an integer multiple of the average period of the jittery signal.

2. The jitter injection circuit according to claim 1, wherein the signal generating section includes an exclusive OR circuit that outputs as the jittery signal an exclusive OR of signals output by the plurality of delay circuits.

3. The jitter injection circuit according to claim 2, further comprising a reference period control section that controls a period of the reference signal supplied to the plurality of delay circuits according to the period of the jitter to be injected into the jittery signal.

4. The jitter injection circuit according to claim 2, further comprising a selecting section that selects whether or not to input into the exclusive OR circuit each signal output by the delay circuits, according to the average period to be included in the jittery signal.

5. The jitter injection circuit according to claim 1, further comprising a data jitter injecting section that generates a data signal having a bit boundary designated by each edge timing of the jittery signal and injects data jitter into the generated data signal.

6. The jitter injection circuit according to claim 1, wherein the delay setting section sets the delay amount of each delay circuit further based on the number of consecutive bits that have identical logic values in a logic pattern to be included in the jittery signal.

7. The jitter injection circuit according to claim 1, further comprising:
a switching section that, when measuring the delay amount of each delay circuit, forms a loop in which an output signal of each delay circuit is returned to an input of the same delay circuit; and
a delay amount calculating section that calculates a delay amount of the delay circuit based on a period of the signal transmitted in the loop, the jitter injection circuit wherein the delay setting section sets the delay amount for each delay circuit further based on the delay amount calculated by the delay amount calculating section.

8. The jitter injection circuit according to claim 1, further comprising a low frequency jitter injecting section that injects into the reference signal jitter having a frequency lower than a frequency of jitter injected in the plurality of delay circuits and the signal generating section and inputs the thus achieved signal into the plurality of delay circuits.

9. The jitter injection circuit according to claim 1, further comprising a low frequency jitter injecting section that injects into the jittery signal jitter having a frequency lower than a frequency of jitter injected in the plurality of delay circuits and the signal generating section.

10. The jitter injection circuit according to claim 1, wherein the delay setting section changes the delay amount in each delay circuit at a frequency lower than a frequency of the jitter injected into the jittery signal.

11. A test apparatus that tests a device under test, comprising:

a jitter injection circuit that generates a jittery signal containing jitter;
a test signal generating section that generates a test signal based on the jittery signal and supplies the generated test signal to the device under test; and
a measuring section that measures a response signal output by the performance circuit in response to the test signal and makes a judgment concerning pass/fail of the performance circuit;
wherein the jitter injection circuit includes:
a plurality of delay circuits that receive a supplied reference signal in parallel, wherein each circuit delays the received reference signal by a preset delay amount; and
a signal generating section that generates each edge of the jittery signal according to a timing of the signal output by each delay circuit, and the delay amount of at least one delay circuit is set to be a value different from an integer multiple of an average period to be included in the jittery signal;
wherein
the jitter injection circuit sequentially generates a first jittery signal into which is injected jitter having a frequency that is within a bandwidth of the device under test and a second jittery signal into which is injected jitter having a frequency that is outside the bandwidth of the device under test, and
the test signal generating section and the measuring section supply to the device under test a first test signal dependent on the first jittery signal, make a judgment concerning pass/fail of the device under test based on a first response signal output by the device under test in response to the first test signal, and, in a case of a test result indicating pass, test the device under test using a second test signal dependent on the second jittery signal.

12. An electronic device that houses a performance circuit and a self diagnostic section that tests the performance circuit, wherein the self diagnostic section includes:
a jitter injection circuit that generates a jittery signal containing jitter, wherein the jitter injection circuit includes a plurality of delay circuits that receive a supplied reference signal in parallel and wherein each circuit delays the received reference signal by a preset delay amount, and wherein the jitter injection circuit sequentially generates a first jittery signal into which is injected jitter having a frequency that is within a bandwidth of the performance circuit and a second jittery signal into which is injected jitter having a frequency that is outside the bandwidth of the performance circuit, and
a signal generating section that generates each edge of the jittery signal according to a timing of the signal output by each delay circuit, and the delay amount of each delay circuit is set to be a value different from an integer multiple of an average period to be included in the jittery signal,
a test signal generating section that generates a test signal based on the jittery signal and supplies the generated test signal to the performance circuit; and
a measuring section that measures a response signal output by the performance circuit in response to the test signal and makes a judgment concerning pass/fail of the performance circuit;
wherein the test signal generating section and the measuring section supply to the performance circuit a first test signal dependent on the first jittery signal,
make a judgment concerning pass/fail of the performance circuit based on a first response signal output by the performance circuit in response to the first test signal, and, in a case of a test result indicating pass, test the performance circuit using a second test signal dependent on the second jittery signal.

13. A pattern generator that generates a data signal that includes both jitter and a predetermined logic pattern, comprising:

a plurality of delay circuits that receive a supplied reference signal in parallel, wherein each circuit delays the received reference signal by a preset delay amount;

a signal generating section that generates each edge of the data signal according to a timing of the signal output by each delay circuit; and a delay setting section that determines what multiple of the single bit time of the data signal is used in the delay amount to be set for each delay circuit according to a timing of logic value shifts in a logic pattern to be to be included in the data signal, and sets for each delay circuit a value obtained by adding or subtracting a jitter value to be injected to or from each of the determined delay amounts, wherein the delay amount of each delay circuit is set to be a value different from an integer multiple of an average period to be included in the jittery signal, and wherein the signal generating section generates a plurality of edges of the jittery signal to generate a plurality of bits of the jittery signal for each single bit of the reference signal.

14. A test apparatus that tests a device under test, comprising:

a pattern generator that generates a test signal that includes both jitter and a predetermined logic pattern and supplies the test signal to the device under test; and a measuring section that measures a response signal output by the device under test in response to the test signal and makes a judgment concerning pass/fail of the device under test based on the measured response signal, the test apparatus;

wherein the pattern generator includes, a plurality of delay circuits that receive a supplied reference signal in parallel, wherein each circuit delays the received reference signal by a preset delay amount;

a signal generating section that generates each edge of the test signal according to a timing of the signal output by each delay circuit; and a delay setting section that determines what multiple of the single bit time of the test signal is used in the delay amount to be set for each delay circuit according to a timing of logic value shifts in a logic pattern to be included in the test signal, and sets for each delay circuit a value obtained by adding or subtracting a jitter value to be injected to or from each of the determined delay amounts, wherein the signal generating section generates a plurality of edges of the jittery signal to generate a plurality of bits of the jittery signal for each single bit of the reference signal, and wherein the delay amount of each delay circuit is set to be a value different from an integer multiple of an average period to be included in the jittery signal.

15. An electronic device that houses a performance circuit and a self diagnostic section that tests the performance circuit, wherein the self diagnostic section includes:

a pattern generator that generates a test signal that includes both jitter and a predetermined logic pattern and supplies the test signal to the device under test; and a measuring section that measures a response signal output by the performance circuit in response to the test signal and makes a judgment concerning pass/fail of the performance circuit based on the measured response signal, wherein the pattern generator includes:

a plurality of delay circuits that receive a supplied reference signal in parallel, wherein each circuit delays the received reference signal by a preset delay amount;

a signal generating section that generates each edge of the test signal according to a timing of the signal output by each delay circuit; and a delay setting section that determines what multiple of the single bit time of the test signal is used in the delay amount to be set for each delay circuit according to a timing of logic value shifts in a logic pattern to be to be included in the test signal, and sets for each delay circuit a value obtained by adding or subtracting a jitter value to be injected to or from each of the determined delay amounts, wherein the delay amount of each delay circuit is set to be a value different from an integer multiple of an average period to be included in the jittery signal;

wherein the signal generating section generates a plurality of edges of the jittery signal to generate a plurality of bits of the jittery signal for each single bit of the reference signal.

* * * * *